(12) United States Patent
Park et al.

(10) Patent No.: US 12,002,429 B2
(45) Date of Patent: Jun. 4, 2024

(54) DISPLAY PANEL AND DISPLAY APPARATUS INCLUDING THE SAME

(71) Applicant: SAMSUNG DISPLAY CO., LTD., Yongin-si (KR)

(72) Inventors: Gyungsoon Park, Yongin-si (KR); Gunhee Kim, Yongin-si (KR); Hyeongseok Kim, Yongin-si (KR); Youngwan Seo, Yongin-si (KR); Chongchul Chai, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/211,322

(22) Filed: Jun. 19, 2023

(65) Prior Publication Data

US 2023/0335063 A1    Oct. 19, 2023

Related U.S. Application Data

(63) Continuation of application No. 17/750,472, filed on May 23, 2022, now Pat. No. 11,715,426, which is a
(Continued)

(30) Foreign Application Priority Data

Jan. 20, 2020    (KR) .................. 10-2020-0007378

(51) Int. Cl.
*G09G 3/00*    (2006.01)
*G06F 3/041*    (2006.01)
(Continued)

(52) U.S. Cl.
CPC ......... *G09G 3/3275* (2013.01); *G09G 3/2003* (2013.01); *H10K 59/124* (2023.02);
(Continued)

(58) Field of Classification Search
CPC ... G09G 2300/0426; G09G 2300/0452; G09G 2300/0819; G09G 2300/0861;
(Continued)

(56) References Cited

U.S. PATENT DOCUMENTS 10,431,604 B2    10/2019    Cho et al.
11,386,850 B2    7/2022    Park et al.
(Continued)

FOREIGN PATENT DOCUMENTS

| KR | 10-2017-0113066 | 10/2017 |
| KR | 10-2018-0057796 | 5/2018 |
| KR | 10-2018-0125061 | 11/2018 |

*Primary Examiner* — Insa Sadio
(74) *Attorney, Agent, or Firm* — F. Chau & Associates, LLC

(57) ABSTRACT

A display panel includes a 1-1st sub-pixel and a 1-2nd sub-pixel disposed in a first row, a 2-1st sub-pixel disposed in a second row and a 3-1st sub-pixel and a 3-2nd sub-pixel disposed in a third row. A first data line extends from the first row to the third row and electrically connects a pixel circuit of the 1-1st sub-pixel, a pixel circuit of the 2-1st sub-pixel, and a pixel circuit of the 3-1st sub-pixel. A 2-1st data line is electrically connected to a pixel circuit of the 1-2nd sub-pixel. A 2-2nd data line is electrically connected to a pixel circuit of the 3-2nd sub-pixel. A first bridge line is disposed on a different layer than the data lines and contacts the 2-1st data line and the 2-2nd data line and includes an overlapping portion extending along at least a portion of the first data line.

21 Claims, 17 Drawing Sheets

Related U.S. Application Data continuation of application No. 17/128,519, filed on Dec. 21, 2020, now Pat. No. 11,386,850.

(51) Int. Cl.
  *G09G 3/20* (2006.01)
  *G09G 3/3275* (2016.01)
  *H10K 59/124* (2023.01)
  *H10K 59/131* (2023.01)
  *H10K 59/35* (2023.01)

(52) U.S. Cl.
  CPC ......... *H10K 59/131* (2023.02); *H10K 59/353* (2023.02); *G09G 2300/0426* (2013.01); *G09G 2300/0452* (2013.01)

(58) Field of Classification Search
  CPC ........... G09G 2310/061; G09G 3/2003; G09G 3/3275; H10K 59/121; H10K 59/124; H10K 59/131; H10K 59/353; H10K 59/65
  See application file for complete search history.

(56) References Cited

U.S. PATENT DOCUMENTS

| | | |
|---|---|---|
| 2016/0291752 A1 | 10/2016 | Li et al. |
| 2017/0053973 A1* | 2/2017 | Park .................... H10K 50/844 |
| 2018/0143669 A1 | 5/2018 | Bok et al. |
| 2019/0130822 A1 | 5/2019 | Jung et al. |
| 2019/0140201 A1* | 5/2019 | Kim .................... H10K 50/844 |
| 2019/0393244 A1 | 12/2019 | Wang et al. |
| 2021/0225292 A1 | 7/2021 | Park et al. |
| 2022/0284864 A1 | 9/2022 | Park et al. |

\* cited by examiner

DISPLAY PANEL AND DISPLAY APPARATUS INCLUDING THE SAME

CROSS-REFERENCE TO RELATED APPLICATIONS

This application is a continuation of U.S. patent application Ser. No. 17/750,472 filed on May 23, 2022, which is a continuation of U.S. patent application Ser. No. 17/128,519 filed on Dec. 21, 2020, now U.S. Pat. No. 11,386,850 issued on Jul. 12, 2022, which claims priority under 35 U.S.C § 119 to Korean Patent Application No. 10-2020-0007378, filed on Jan. 20, 2020 in the Korean Intellectual Property Office, the disclosures of which are incorporated by reference in their entireties herein.

1. TECHNICAL FIELD

One or more exemplary embodiments of the present inventive concepts relate to a display panel and a display apparatus including the display panel, and more particularly, a display panel, which has an expanded display area for displaying an image, and a display apparatus including the display panel.

2. DISCUSSION OF RELATED ART

Display panels generally include sub-pixels that are uniformly arranged to display various images. Display panels are applied to a wide range of electronic devices due to their thinness and light weight.

Since display apparatuses are used in a variety of different electronic devices, various methods may be applied in designing the shapes of the display apparatuses.

However, in existing display panels, the area of a display area for displaying an image is limited when the display panel includes a component that is an electronic element.

SUMMARY

One or more exemplary embodiments include a display panel, which has an expanded display area to display an image even in an area where a component, which is an electronic element, is arranged, and a display apparatus including the display panel. However, it should be understood that exemplary embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to one or more exemplary embodiments, a display panel includes a 1-1st sub-pixel and a 1-2nd sub-pixel disposed in a first row. A 2-1st sub-pixel is disposed in a second row. A 3-1st sub-pixel and a 3-2nd sub-pixel are disposed in a third row. A first data line is configured to electrically connect a pixel circuit of the 1-1st sub-pixel, a pixel circuit of the 2-1st sub-pixel, and a pixel circuit of the 3-1st sub-pixel. A 2-1st data line is configured to be electrically connected to a pixel circuit of the 1-2nd sub-pixel. A 2-2nd data line is configured to be electrically connected to a pixel circuit of the 3-2nd sub-pixel. A first bridge line is disposed on a different layer than the first data line, the 2-1st data line, and the 2-2nd data line. The first bridge line has a first side contacting the 2-1st data line and a second side contacting the 2-2nd data line. The first bridge line has a portion extending along at least a portion of the first data line.

The $1\text{-}1^{st}$ sub-pixel, the $1\text{-}2^{nd}$ sub-pixel, the $2\text{-}1^{st}$ sub-pixel, the $3\text{-}1^{st}$ sub-pixel, and the $3\text{-}2^{nd}$ sub-pixel may be on a substrate, wherein an orthographic projection image of the portion of the first bridge line extending along the at least a portion of the first data line onto a top surface of the substrate may, overlap an orthographic projection image of the first data line onto the top surface of the substrate.

The display panel may further include: a $1\text{-}3^{rd}$ sub-pixel and a $1\text{-}4^{th}$ sub-pixel in the first row, wherein the $1\text{-}3^{rd}$ sub-pixel is in an opposite direction to the $1\text{-}2^{nd}$ sub-pixel with respect to the $1\text{-}1^{st}$ sub-pixel and the $1\text{-}4^{th}$ sub-pixel is between the $1\text{-}1^{st}$ sub-pixel and the $1\text{-}2^{nd}$ sub-pixel; a $2\text{-}2^{nd}$ sub-pixel in the second row; a $3\text{-}3^{d}$ sub-pixel and a $3\text{-}4^{th}$ sub-pixel in the third row, wherein the $3\text{-}3^{rd}$ sub-pixel is in an opposite direction to the $3\text{-}2^{nd}$ sub-pixel with respect to the $3\text{-}1^{st}$ sub-pixel and the $3\text{-}4^{th}$ sub-pixel is between the $3\text{-}1^{st}$ sub-pixel and the $3\text{-}2^{nd}$ sub-pixel; a third data line electrically connecting a pixel circuit of the $1\text{-}3^{rd}$ sub-pixel, a pixel circuit of the $2\text{-}2^{nd}$ sub-pixel, and a pixel circuit of the $3\text{-}3^{rd}$ sub-pixel; a $4\text{-}1^{st}$ data line electrically connected to a pixel circuit of the $1\text{-}4^{th}$ sub-pixel; a $4\text{-}2^{nd}$ data line electrically connected to a pixel circuit of the $3\text{-}4^{th}$ sub-pixel; and a second bridge line on a different layer than the third data line, the $4\text{-}1^{st}$ data line, and the $4\text{-}2^{nd}$ data line, the second bridge line having one side contacting the $4\text{-}1^{st}$ data line and the other side contacting the $4\text{-}2^{nd}$ data line, the second bridge line having a portion extending along at least a portion of the third data line.

The $1\text{-}3^{rd}$ sub-pixel, the $1\text{-}4^{th}$ sub-pixel, the $2\text{-}2^{nd}$ sub-pixel, the $3\text{-}3^{rd}$ sub-pixel, and the $3\text{-}4^{th}$ sub-pixel may be on the substrate, wherein an orthographic projection image of the portion of the second bridge line extending along the at least a portion of the third data line onto a top surface of the substrate, may overlap an orthographic projection image of the third data line onto the top surface of the substrate.

The third data line, the $4\text{-}1^{st}$ data line, and the $4\text{-}2^{nd}$ data line may be on the same layer as the first data line, the $2\text{-}1^{st}$ data line, and the $2\text{-}2^{nd}$ data line, and the second bridge line may be on the same layer as the first bridge line.

The first bridge line and the second bridge line may be on an insulating layer covering the first data line, the $2\text{-}1^{st}$ data line, the $2\text{-}2^{nd}$ data line, the third data line, the $4\text{-}1^{st}$ data line, and the $4\text{-}2^{nd}$ data line.

The display panel may include a component area and a main display area surrounding the component area, wherein the $1\text{-}1^{st}$ sub-pixel, the $1\text{-}2^{nd}$ sub-pixel, the $3\text{-}1^{st}$ a sub-pixel, and the $3\text{-}2^{nd}$ sub-pixel may be in the main display area, and the $2\text{-}1^{st}$ sub-pixel may be in the component area.

The component area may include a transmission area outside the $2\text{-}1^{st}$ sub-pixel.

The display panel may further include an additional data line electrically connected to a pixel circuit of one sub-pixel in the component area, wherein the additional data line may extend along an edge of the transmission area.

The resolution of the component area may be ½ or less of the resolution of the main display area.

The display panel may further include an auxiliary driving voltage line electrically connected to the pixel circuit of the $2\text{-}1^{st}$ sub-pixel to apply a driving voltage thereto, wherein the auxiliary driving voltage line may be in the component area and be on a different layer than the first data line and the first bridge line and overlap the first data line and the first bridge line.

The auxiliary driving voltage line may be under the first data line and the first bridge line.

The display panel may further include: a driving voltage line in the main display area, the driving voltage line being electrically connected to the pixel circuit of the 1-1$^{st}$ sub-pixel to apply a driving voltage thereto.

The driving voltage line may be on a layer on which the first data line is.

A width of the auxiliary driving voltage line may be greater than a width of the driving voltage line.

The display panel may further include: a 1-5$^{th}$ sub-pixel in the first row; a 3-5$^{th}$ sub-pixel in the third row; and a fifth data line electrically connecting a pixel circuit of the 1-5$^{th}$ sub-pixel and a pixel circuit of the 3-5$^{th}$ sub-pixel, wherein the display panel may include a component area and a main display area surrounding the component area, wherein the 1-1$^{st}$ sub-pixel, the 1-2$^{nd}$ sub-pixel, the 1-5$^{th}$ sub-pixel, the 3-1$^{st}$ sub-pixel, the 3-2$^{nd}$ sub-pixel, and the 3-5$^{th}$ sub-pixel may be in the main display area, and the 2-1$^{st}$ sub-pixel may be in the component area, wherein the fifth data line may cross the component area, but may not be connected to pixel circuits of sub-pixels in the component area.

The display panel may further include: a 1-6$^{th}$ sub-pixel in the first row; a 3-6$^{th}$ sub-pixel in the third row; a 6-1$^{st}$ data line electrically connected to the 1-6$^{th}$ sub-pixel; a 6-2$^{nd}$ data line electrically connected to the 3-6$^{th}$ sub-pixel; and a third bridge line on a different layer than the 6-1$^{st}$ data line and the 6-2$^{nd}$ data line, the third bridge line having one side contacting the 6-1$^{st}$ data line and the other side contacting the 6-2$^{nd}$ data line, the third bridge line having a portion extending along at least a portion of the fifth data line.

The 6-1$^{st}$ data line and the 6-2$^{nd}$ data line may be on a layer on which the first data line, the 2-1$^{st}$ data line, and the 2-2$^{nd}$ data line are, and the third bridge line may be on a layer on which the first bridge line is.

The first bridge line and the third bridge line may be on an insulating layer covering the first data line, the 2-1$^{st}$ data line, the 2-2$^{nd}$ data line, the 6-1$^{st}$ data line, and the 6-2$^{nd}$ data line.

According to one or more exemplary embodiments, a display apparatus includes: a display panel including a component area and a main display area surrounding the component area; and an electronic element arranged to correspond to the component area of the display panel. The display panel includes a 1-1st sub-pixel and a 1-2nd sub-pixel disposed in a first row. A 2-1st sub-pixel is disposed in a second row. A 3-1st sub-pixel and a 3-2nd sub-pixel are disposed in a third row. A first data line is configured to electrically connect a pixel circuit of the 1-1st sub-pixel, a pixel circuit of the 2-1st sub-pixel, and a pixel circuit of the 3-1st sub-pixel. A 2-1st data line is configured to be electrically connected to a pixel circuit of the 1-2nd sub-pixel. A 2-2nd data line is configured to be electrically connected to a pixel circuit of the 3-2nd sub-pixel. A first bridge line is disposed on a different layer than the first data line, the 2-1st data line, and the 2-2nd data line. The first bridge line has a first side contacting the 2-1st data line and a second side contacting the 2-2nd data line. The first bridge line has a portion extending along at least a portion of the first data line.

The electronic element may include an imaging device.

According to an exemplary embodiment of the present inventive concepts, a display panel includes a component area that is surrounded by a main display area. The component area has a plurality of auxiliary sub-pixels and a transmission area surrounding the auxiliary sub-pixels. The transmission area is configured for transmission of light therethrough. The main display area has a first plurality of main sub-pixels disposed in a lower row adjacent to a lower side of the component area and a second plurality of main sub-pixels disposed in an upper row adjacent to an upper side of the component area. At least one first data line extends across the component area from the lower row to the upper row. Each of the at least one first data line is configured to electrically connect sub-pixels in the lower row and the upper row and a first auxiliary sub-pixel. At least one lower second data line is configured to be electrically connected to sub-pixels in the lower row. At least one upper second data line is configured to be electrically connected to sub-pixels in the upper row. At least one bridge line has a first end connected to one lower second data line and a second end connected to one upper second data line. At least one bridge line is disposed on a different layer than the at least one first data line and each of the at least one bridge line has an overlapping portion that extends along at least a portion of one first data line.

Other aspects, features, and advantages than the above-described aspects, features, and advantages will be apparent from a detailed description, the claims, and the drawings.

BRIEF DESCRIPTION OF THE DRAWINGS

The above and other aspects, features, and advantages of exemplary embodiments of the present inventive concepts will be more apparent from the following description taken in conjunction with the accompanying drawings, in which.

DETAILED DESCRIPTION OF EXEMPLARY EMBODIMENTS

Figure 1:
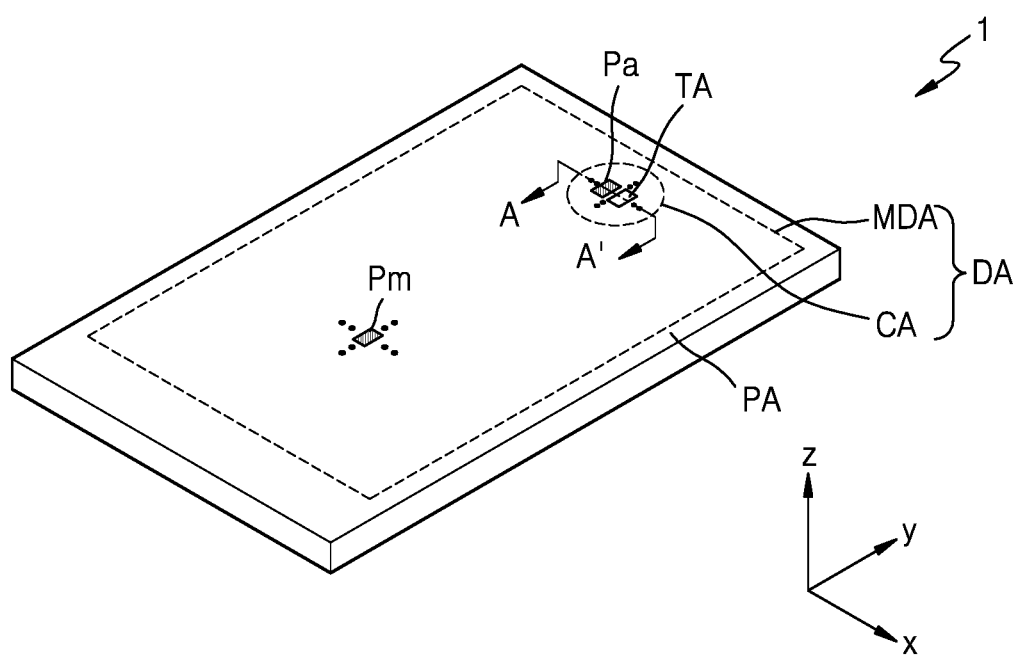
FIG. 1 is a perspective view of a display apparatus according to an exemplary embodiment of the present inventive concepts.

Reference will now be made in detail to embodiments, examples of which are illustrated in the accompanying drawings, wherein like reference numerals refer to like elements throughout. In this regard, exemplary embodiments of the present inventive concepts may have different forms and should not be construed as being limited to the descriptions set forth herein. Accordingly, exemplary embodiments of the present inventive concepts are merely described below, by referring to the figures, to explain aspects of the present inventive concepts. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While exemplary embodiments of the present inventive concepts are illustrated in the drawings and described in the detailed description thereof, exemplary embodiments of the present inventive concepts may have diverse modified embodiments. An effect and a characteristic of the present inventive concepts, and a method of accomplishing these will be apparent when referring to exemplary embodiments described with reference to the drawings. The present inventive concepts may, however, be embodied in many different forms and should not be construed as limited to the exemplary embodiments set forth herein.

One or more exemplary embodiments of the present inventive concepts will be described below in more detail with reference to the accompanying drawings. Those components that are the same or are in correspondence are rendered the same reference numeral regardless of the figure number, and redundant explanations are omitted for convenience of explanation.

It will be understood that when a layer, region, or component is referred to as being "formed on," or "disposed on," another layer, region, or component, it can be directly or indirectly formed on the other layer, region, or component. For example, intervening layers, regions, or components may be present. However, when a layer, region, or component is referred to as being "formed directly on," or "disposed directly on," another layer, region, or component, no intervening layers, regions, or components may be present. Sizes of elements in the drawings may be exaggerated for convenience of explanation. For example, since sizes and thicknesses of components in the drawings are arbitrarily illustrated for convenience of explanation, the following embodiments are not limited thereto.

In the following exemplary embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display apparatus 1 according to an exemplary embodiment of the present inventive concepts.

Referring to the exemplary embodiment of FIG. 1, the display apparatus 1 includes a display area DA and a peripheral area PA outside the display area DA. The display area DA includes a component area CA and a main display area MDA at least partially surrounding the component area CA. In an exemplary embodiment, the component area CA and the main display area MDA may display images individually or together. The peripheral area PA may be a non-display area in which display elements are not arranged. The display area DA may be entirely surrounded by the peripheral area PA. However, exemplary embodiments of the present inventive concepts are not limited thereto. For example, in other exemplary embodiments, the display area DA may extend to at least one edge of the display apparatus 1 and may not be surrounded by the peripheral area PA on at least one side.

FIG. 1 illustrates that one component area CA is located in the main display area MDA. However, exemplary embodiments of the present inventive concepts are not limited thereto. For example, in other exemplary embodiments, the display apparatus 1 may have a plurality of component areas CA. The shapes and sizes of each of the plurality of component areas CA may be the same or at least one of the plurality of component areas CA may be different from each other. The plurality of component areas CA may be arranged in the display area DA in various different arrangements.

Hereinafter, an organic light-emitting display apparatus will be described as the display apparatus 1 according to an exemplary embodiment of the present inventive concepts. However, exemplary embodiments of the present inventive concepts are not limited thereto. For example, in other exemplary embodiments, the display apparatus 1 may be an inorganic light-emitting display apparatus (or inorganic electro-luminescence (EL) display apparatus), a quantum dot light-emitting display apparatus, etc. For example, an emission layer of a display element of the display apparatus 1 may include an organic material, an inorganic material, a quantum dot, an organic material and a quantum dot, or an inorganic material and a quantum dot.

In the exemplary embodiment of FIG. 1, the component area CA is illustrated as having a substantially circular shape. However, exemplary embodiments of the present inventive concepts are not limited thereto and the component area CA may have various different shapes when viewed in a direction substantially perpendicular to an upper surface of a substrate (e.g., in a plan view in a plane defined by the x direction and the y direction), the component area CA may have one of various shapes including an ellipse, a polygon such as a square, a star shape, and a diamond shape, an irregular shape, etc.

In the exemplary embodiment of FIG. 1, when viewed in the direction substantially perpendicular to the upper surface of the substrate (e.g., in a plan view in a plane defined in the x direction and the y direction), the component area CA is arranged in the center (e.g., in the x direction) of the upper side (+y direction) of the main display area MDA having a substantially rectangular shape. However, exemplary embodiments of the present inventive concepts are not limited thereto. For example, the component area CA may be arranged in various different areas of the main display area MDA, such as on one side in the x direction (e.g., the upper right side or the upper left side) of the main display area MDA having a substantially rectangular shape. While the main display area MDA is shown in the exemplary embodiment of FIG. 1 as having a substantially rectangular shape, exemplary embodiments of the present inventive concepts are not limited thereto. In other exemplary embodiments, the main display area MDA may have various different shapes including spherical, polygonal and irregular shapes.

The display apparatus 1 may provide an image using a plurality of main sub-pixels Pm arranged in the main display area MDA and a plurality of auxiliary sub-pixels Pa arranged in the component area CA.

As described below with reference to the exemplary embodiment of FIG. 2, a component 20 that is an electronic element may be arranged under the component area CA. In an exemplary embodiment, the component 20 is a camera using infrared light or visible light and may include an imaging device. Alternatively, the component 20 may have a function of receiving sound. In order to reduce the limitation of the function of the component 20, the component area CA may include a transmission area TA for transmitting light and/sound that is output from the component 20 to the outside and/or from the outside to the component 20. The transmission area TA may not include pixels or sub-pixels. With a display panel 10 according to an exemplary embodiment of the present inventive concepts and a display apparatus 1 having the display panel 10 according to an exemplary embodiment of the present inventive concepts, when infrared light is transmitted through the component area CA, a light transmittance may be about 10% or more, for example, about 20% or more, about 25% or more, about 50% or more, about 85% or more, or about 90% or more.

A plurality of auxiliary sub-pixels Pa may be arranged in the component area CA. The plurality of auxiliary sub-pixels Pa may emit light to generate an image. An image displayed in the component area CA is an auxiliary image and may have a lower resolution than an image displayed in the main display area MDA. Since the component area CA includes the transmission area TA capable of transmitting light and sound and a sub-pixel is not arranged in the transmission area TA, the number of auxiliary sub-pixels Pa that may be arranged per unit area may be less than the number of main sub-pixels Pm arranged per unit area in the main display area MDA.

Figure 2:
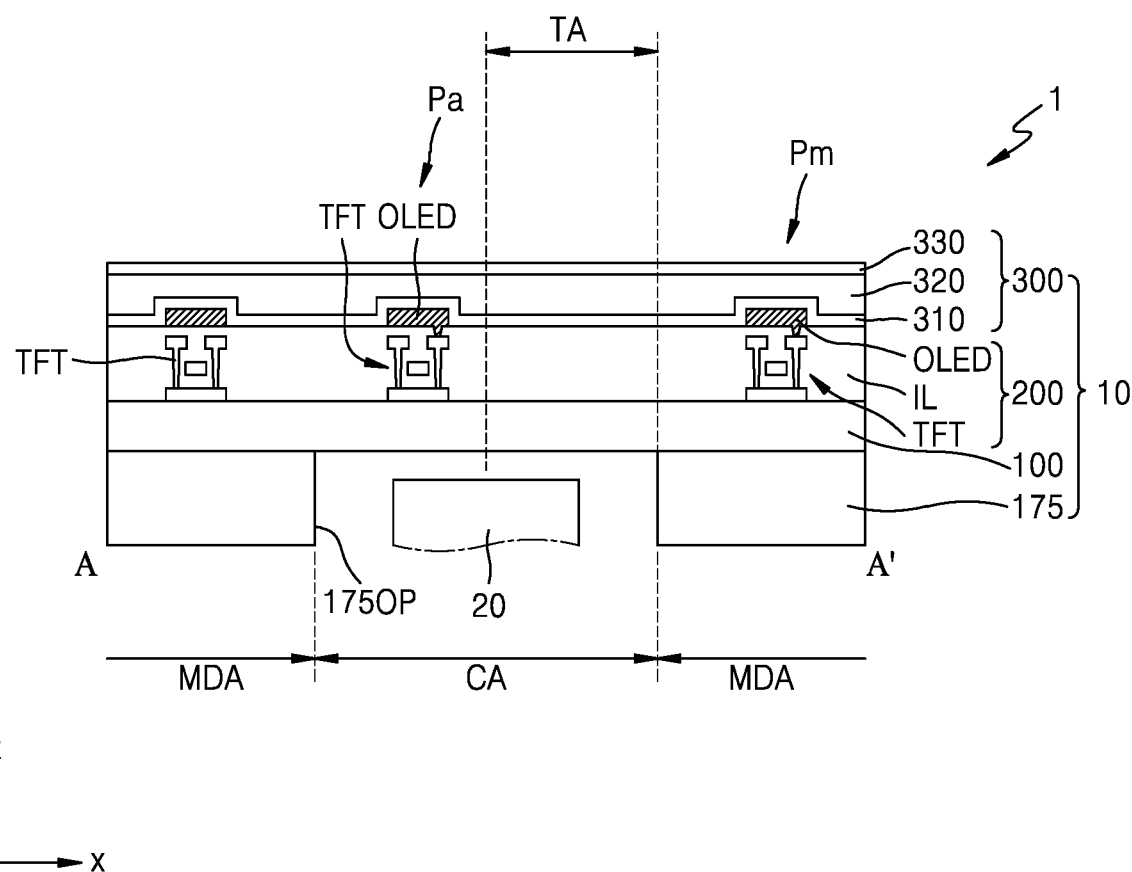
FIG. 2 is a cross-sectional view of a display apparatus taken along line A-A' of FIG. 1 according to an exemplary embodiment of the present inventive concepts.

FIG. 2 is a schematic cross-sectional view of a portion of a display apparatus 1 taken along line A-A' of FIG. 1 according to an exemplary embodiment of the present inventive concepts.

Referring to the exemplary embodiment of FIG. 2, the display apparatus 1 may include a display panel 10 including a display element, and a component 20 that is located under the display panel 10 (e.g., in a −z direction) and is an electronic element corresponding to the component area CA.

The display panel 10 may include a substrate 100, a display element layer 200 arranged on the substrate 100, and a thin-film encapsulation layer 300 that seals the display element layer 200. The display panel 10 may further include various components. For example, as shown in the exemplary embodiment of FIG. 2, the display panel 10 may further include a lower protection film 175 and the like arranged under the substrate 100.

In an exemplary embodiment, the substrate 100 may include glass or polymer resin. For example, the substrate 100 may include polymer resin such as at least one compound selected from polyethersulphone, polyacrylate, polyetherimide, polyethylene naphthalate, polyethylene terephthalate, polyphenylene sulfide, polyarylate, polyimide, polycarbonate, and cellulose acetate propionate. The substrate 100 including polymer resin may be flexible, rollable, or bendable. The substrate 100 may have a multi-layered structure including a layer including the aforementioned polymer resin and an inorganic layer. For example, the substrate 100 may include two layers including the aforementioned polymer resin and an inorganic barrier layer interposed therebetween. However, exemplary embodiments of the present inventive concepts are not limited thereto.

The display element layer 200 may include a circuit layer including thin-film transistors TFT, organic light-emitting diodes OLED being display elements, and an insulating layer IL between the circuit layer and the organic light-emitting diodes OLED.

A main sub-pixel Pm is arranged in the main display area MDA. The main sub-pixel Pm includes a pixel circuit including a thin-film transistor TFT and an organic light-emitting diode OLED electrically connected to the pixel circuit. In addition, wiring lines electrically connected to the main sub-pixel Pm and an auxiliary sub-pixel Pa may be arranged in the main display area MDA.

In the component area CA, the auxiliary sub-pixel Pa, which includes a pixel circuit including a thin-film transistor TFT and an organic light-emitting diode OLED electrically connected to the pixel circuit, is arranged. In addition, the component area CA may have a transmission area TA having no thin-film transistors TFT and no sub-pixels arranged therein. The transmission area TA is an area through which light/sound/signals emitted from the component 20 or light/sound/signals incident on the component 20 (e.g., from the external environment) may at least partially pass.

The component 20 located under (e.g., in the −z direction) the display panel 10 may be located to correspond to the component area CA. The component 20 may be an electronic element that uses light or sound. For example, the component 20 may be an imaging device such as a camera, a sensor that receives and uses light, like an infrared sensor, a sensor that outputs and senses light or sound to measure a distance or recognize a fingerprint or the like, a small lamp that outputs light, or a speaker that outputs sound. However, exemplary embodiments of the present inventive concepts are not limited thereto. An electronic element using light may use light in various wavelength bands, such as visible light, infrared light, and ultraviolet light. In the component area CA, one component 20 may be arranged, or a plurality of components 20 may be arranged. For example, a first component, such as a light-emitting element and a second component, such as a light-receiving element may be arranged to correspond to one component area CA. Alternatively, one component 20 may include both a light-emitting portion and a light-receiving portion, and may be arranged to correspond to one component area CA.

In an exemplary embodiment, the thin-film encapsulation layer 300 may include at least one inorganic encapsulation layer and at least one organic encapsulation layer. FIG. 2 illustrates, as an example, that the thin-film encapsulation layer 300 includes a first inorganic encapsulation layer 310, a second inorganic encapsulation layer 330, and an organic encapsulation layer 320 therebetween (e.g., in the z direction). However, exemplary embodiments of the present inventive concepts are not limited thereto.

In an exemplary embodiment, the first and second inorganic encapsulation layers 310 and 330 may include one or more inorganic insulating materials selected from aluminum oxide, titanium oxide, tantalum oxide, hafnium oxide, zinc oxide, silicon oxide, silicon nitride, and silicon oxynitride. The organic encapsulation layer 320 may include a polymer-based material. For example, the polymer-based material may include polyethylene terephthalate, polyethylene naphthalate, polycarbonate, polyimide, polyethylene sulfonate, polyoxymethylene, polyarylate, hexamethyldisiloxane, acryl-based resin (e.g., polymethyl methacrylate or polyacryl acid), or any combination thereof.

The lower protection film 175 may be attached to a lower surface of the substrate 100 and may support and protect the substrate 100. For example, as shown in the exemplary embodiment of FIG. 2, an upper surface of the lower protection film 175 may directly contact a lower surface of the substrate 100. The lower protection film 175 may have an opening 175OP corresponding to the component area CA. Since the lower protection film 175 has the opening 175OP, light/sound passing through the component area CA may be directed to the component 20, or light/sound from the component 20 may enter the component area CA. In an exemplary embodiment, the lower protection film 175 may include polyethylene terephthalate or polyimide.

The area (e.g., area in the X and Y directions) of the component area CA may be greater than an area where the component 20 is arranged. Although the component area CA and the opening 175OP in the lower protection film 175 have the same areas in FIG. 2, this is merely an example. The area of the opening 175OP in the lower protection film 175 may not be equal to the area of the component area CA. For example, the area of the opening 175OP may be less than the area of the component area CA.

Although not shown in FIG. 2, an input sensing member for sensing a touch input may be arranged on the display panel 10. In addition, an anti-reflection member including a polarizer and a retarder or including a color filter and a black matrix may be arranged on the display panel 10. Furthermore, a component such as a cover having a transparent window may be arranged on the display panel 10.

In FIG. 2, as described above, the thin-film encapsulation layer 300 is used as an encapsulation member that seals the display element layer 200. However, exemplary embodiments of the present inventive concepts are not limited thereto. For example, an encapsulation substrate coupled with the substrate 100 by a sealant or frit may be used as a member that seals the display element layer 200.

Figure 3:
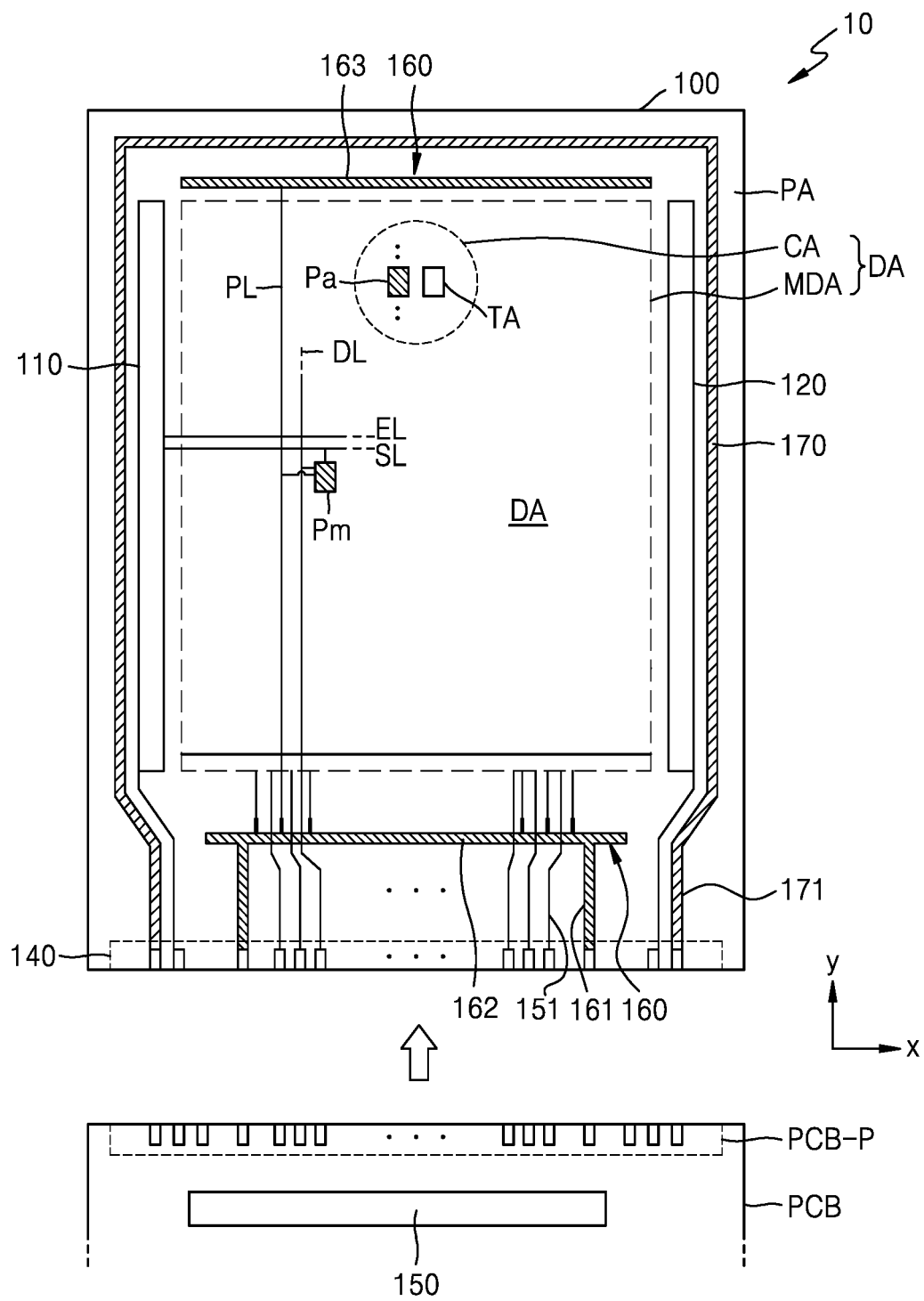
FIG. 3 is a plan view of a display panel that may be included in the display apparatus of FIG. 1 according to an exemplary embodiment of the present inventive concepts.

FIG. 3 is a schematic plan view of a display panel 10 that may be included in the display apparatus 1 of FIG. 1 according to an exemplary embodiment of the present inventive concepts.

Referring to the exemplary embodiment of FIG. 3, various components that constitute the display panel 10 are arranged on a substrate 100. The substrate 100 includes a display area DA and a peripheral area PA surrounding the display area DA (e.g., in the x and y directions). The display area DA includes a main display area MDA, on which a main image is displayed, and a component area CA, which includes a transmission area TA and on which an auxiliary image is displayed. In an exemplary embodiment, the auxiliary image may form one whole image together with the main image, and the auxiliary image may be an image independent from the main image.

A plurality of main sub-pixels Pm are arranged in the main display area MDA. Each of the plurality of main sub-pixels Pm may include a display element, such as an organic light-emitting diode OLED. Each of the plurality of main sub-pixels Pm may emit, for example, red light, green light, blue light, or white light. However, exemplary embodiments of the present inventive concepts are not limited thereto. The thin-film encapsulation layer 300 may cover the main display area MDA for protection from ambient air or moisture as described above with reference to FIG. 2.

The component area CA may be arranged inside the main display area MDA, and a plurality of auxiliary sub-pixels Pa are arranged in the component area CA. Each of the plurality of auxiliary sub-pixels Pa may include a display element such as an organic light-emitting diode. Each of the plurality of auxiliary sub-pixels Pa may emit, for example, red light, green light, blue light, or white light. However, exemplary embodiments of the present inventive concepts are not limited thereto. The thin-film encapsulation layer 300 may cover the component area CA for protection from ambient air or moisture as described above with reference to FIG. 2.

The component area CA may include a transmission area TA. The transmission area TA may be arranged to surround a plurality of auxiliary sub-pixels Pa. Alternatively, the transmission area TA may be arranged in a lattice shape with a plurality of auxiliary sub-pixels Pa (see FIG. 10).

Since the component area CA includes the transmission area TA, the resolution of the component area CA may be lower than that of the main display area MDA. For example, in exemplary embodiments, the resolution of the component area CA may be about ½, about ⅜, about ⅓, about ¼, about ⅖, about ⅛, about ⅑, about 1/16 or the like of the resolution of the main display area MDA. For example, in an exemplary embodiment, the resolution of the main display area MDA may be about 400 ppi or more, and the resolution of the component area CA may be about 200 ppi or about 100 ppi.

Each of the main and auxiliary sub-pixels Pm and Pa may be electrically connected to outer circuits arranged in the peripheral area PA. A first scan driving circuit 110, a second scan driving circuit 120, a terminal 140, a first power supply line 160, and a second power supply line 170 may be arranged in the peripheral area PA.

The first scan driving circuit 110 may apply a scan signal to each of the main and auxiliary sub-pixels Pm and Pa through a scan line SL. In addition, the first scan driving circuit 110 may apply an emission control signal to each pixel through an emission control line EL. The second scan driving circuit 120 may be located on the opposite side (e.g., in the +x direction) of the first scan driving circuit 110 with respect to the main display area MDA, and may be substantially parallel to the first scan driving circuit 110. A first plurality of the main sub-pixels Pm in the main display area MDA may be electrically connected to the first scan driving circuit 110, and the remaining main sub-pixels Pm (e.g., a second plurality of the main sub-pixels Pm) may be electrically connected to the second scan driving circuit 120. The second scan driving circuit 120 may apply a scan signal and an emission control signal, via the scan line SL and the emission control line EL, to main sub-pixels Pm electrically connected to the second scan driving circuit 120 from among the main sub-pixels Pm in the main display area MDA. A first plurality of the auxiliary sub-pixels Pa in the component area CA may be electrically connected to the first scan driving circuit 110, and the remaining auxiliary sub-pixels Pa (e.g., a second plurality of the auxiliary sub-pixels Pa) may be electrically connected to the second scan driving circuit 120. The second scan driving circuit 120 may apply a scan signal and an emission control signal, via the scan line SL and the emission control line EL, to auxiliary sub-pixels Pa electrically connected to the second scan driving circuit 120 from among the auxiliary sub-pixels Pa in the component area CA.

Alternatively, each of the main sub-pixels Pm in the main display area MDA may be electrically connected to both the first scan driving circuit 110 and the second scan driving circuit 120 and thus may receive a scan signal via a scan line SL connected to both the first scan driving circuit 110 and the second scan driving circuit 120 and receive an emission control signal via an emission control line EL connected to both the first scan driving circuit 110 and the second scan driving circuit 120. Each of the auxiliary sub-pixels Pa in the component area CA may also be electrically connected to both the first scan driving circuit 110 and the second scan driving circuit 120 and thus may receive a scan signal via a scan line SL connected to both the first scan driving circuit 110 and the second scan driving circuit 120 and receive an emission control signal via an emission control line EL connected to both the first scan driving circuit 110 and the second scan driving circuit 120.

However, exemplary embodiments of the present inventive concepts are not limited thereto and the second scan driving circuit 120 may be omitted in some exemplary embodiments. In such embodiment, all of the main sub-pixels Pm in the main display area MDA may be electrically connected to the first scan driving circuit 110, and similarly, all of the auxiliary sub-pixels Pa in the component area CA may be electrically connected to the first scan driving circuit 110.

For reference, although the first scan driving circuit 110 is illustrated as one component in FIG. 3, exemplary embodiments of the present inventive concepts are not limited thereto. For example, the first scan driving circuit 110 may include a first scan signal driving circuit and a first emission control driving circuit that are separated from each other (e.g., in the x and/or y direction). In this embodiment, the first scan signal driving circuit may be electrically connected to the scan line SL, and the first emission control driving circuit may be electrically connected to the emission control line EL. The second scan driving circuit 120 may also include a second scan signal driving circuit and a second emission control driving circuit separated from each other. In this embodiment, the second scan signal driving circuit may be electrically connected to the scan line SL, and the second emission control driving circuit may be electrically connected to the emission control line EL.

The terminal 140 may be arranged on one side of the substrate 100. For example, as shown in the exemplary embodiment of FIG. 3, the terminal 140 may be arranged on a lower side of the substrate 100 (e.g., in the −y direction). The terminal 140 may be exposed by not being covered by an insulating layer and electrically connected to a printed circuit board PCB. A terminal PCB-P of the printed circuit board PCB may be electrically connected to the terminal 140 of the display panel 10. The printed circuit board PCB transmits a signal or power of a controller to the display panel 10. A control signal generated by the controller may be transmitted to each of the first and second scan driving circuits 110 and 120 through the printed circuit board PCB. The controller may supply a first power supply voltage ELVDD (see FIGS. 7 and 8) to a first power supply line 160 through a first connection line 161, and may supply a second power supply voltage ELVSS (see FIGS. 7 and 8) to a second power supply line 170 through a second connection line 171. The first power supply voltage ELVDD may be applied to each of the main and auxiliary sub-pixels Pm and Pa through a driving voltage line PL connected to the first power supply line 160, and the second power supply voltage ELVSS may be applied to an opposite electrode of each of the main and auxiliary sub-pixels Pm and Pa connected to the second power supply line 170. The first power supply voltage ELVDD may be referred to as a driving voltage. Hereinafter, the first power supply voltage ELVDD is referred to as a driving voltage for convenience.

The data driving circuit 150 is electrically connected to a data line DL. A data signal of the data driving circuit 150 may be applied to the main and auxiliary sub-pixels Pm and Pa through a connection line 151 connected to the terminal 140 and the data line DL connected to the connection line 151. Although the exemplary embodiment of FIG. 3 illustrates that the data driving circuit 150 is arranged on the printed circuit board PCB, exemplary embodiments of the present inventive concepts are not limited thereto and in other exemplary embodiments the data driving circuit 150 may be arranged on the substrate 100. For example, the data driving circuit 150 may be arranged between the terminal 140 and the first power supply line 160 (e.g., in the y direction).

The first power supply line 160 may include a first sub-line 162 and a second sub-line 163 extending in the x-axis direction and spaced apart from the first power supply line 160 in the y direction with the main display area MDA therebetween. The second sub-line 163 located in the +y direction of the main display area MDA may be electrically connected to the first sub-line 162 located in the −y direction of the main display area MDA, via some of driving voltage lines PL extending along the y-axis so as to cross the main display area MDA, as shown in FIG. 3. For example, some of the driving voltage lines PL may be electrically connected only to the first sub-line 162, some of the driving voltage lines PL may be electrically connected only to the second sub-line 163, and some of the driving voltage lines PL may be electrically connected to both the first sub-line 162 and the second sub-line 163. Alternatively, a line may be located in the peripheral area PA such that the line may electrically connect the second sub-line 163 to the first sub-line 162.

The second power supply line 170 may have a loop shape with one open side (e.g., a lower side in the Y direction) and partially surround the main display area MDA.

Figure 4:
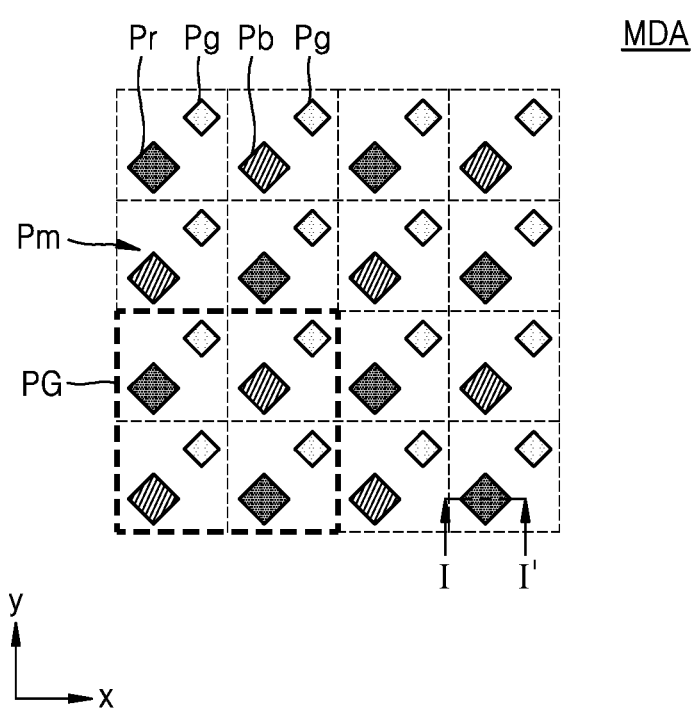
FIG. 4 is a plan view illustrating a pixel arrangement structure in a main display area of the display panel of FIG. 3 according to an exemplary embodiment of the present inventive concepts.
Figure 5:
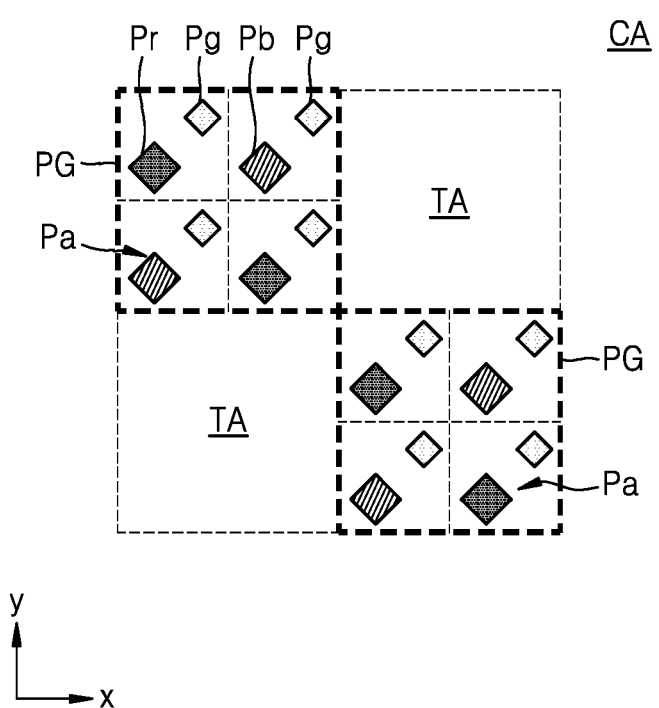
FIGS. 5 and 6 are plan views illustrating a pixel arrangement structure in a component area of the display panel of FIG. 3 according to exemplary embodiments of the present inventive concepts.
Figure 6:
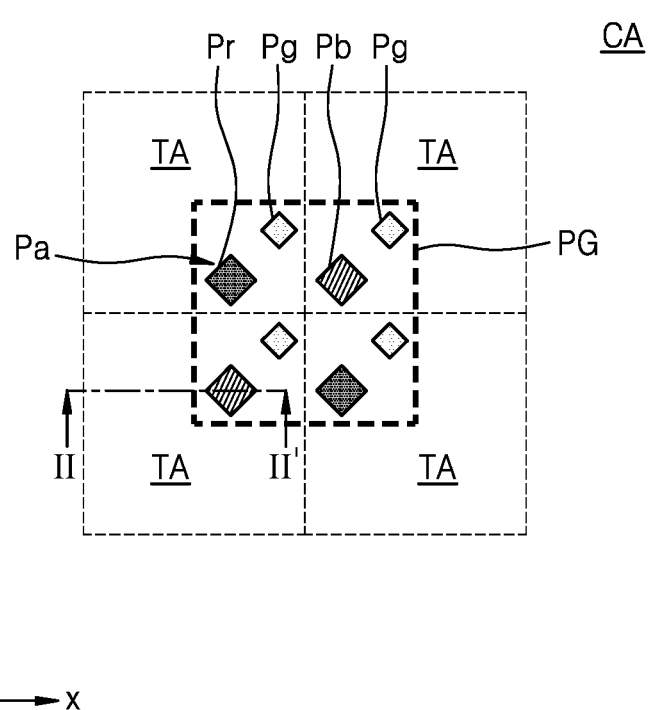

FIG. 4 is a schematic plan view illustrating a pixel arrangement structure in a main display area MDA of the display panel 10 of FIG. 3, and FIGS. 5 and 6 are schematic plan views illustrating a pixel arrangement structure in a component area CA of the display panel 10 of FIG. 3 according to exemplary embodiments of the present inventive concepts.

As shown in the exemplary embodiment of FIG. 4, a plurality of main sub-pixels Pm may be arranged in the main display area MDA. Each of the plurality of main sub-pixels Pm may include a display element such as an organic light-emitting diode. Each of the plurality of main sub-pixels Pm may emit one of red light, green light, blue light, and white light. However, exemplary embodiments of the present inventive concepts are not limited thereto. For example, the plurality of main sub-pixels Pm may include a main sub-pixel Pr emitting red light, a main sub-pixel Pg emitting green light, and a main sub-pixel Pb emitting blue light. In the exemplary embodiment of FIG. 4, the plurality of main sub-pixels Pm are arranged in a pentile type. However, exemplary embodiments of the present inventive concepts are not limited thereto. For example, in other exemplary embodiments, the plurality of main sub-pixels Pm may be arranged in a stripe shape or various other shapes.

As shown in the exemplary embodiment of FIG. 5, a plurality of auxiliary sub-pixels Pa may be arranged in the component area CA. Each of the plurality of auxiliary sub-pixels Pa may include a display element such as an organic light-emitting diode. Each of the plurality of auxiliary sub-pixels Pa may emit one of red light, green light, blue light, and white light. However, exemplary embodiments of the present inventive concepts are not limited thereto.

The component area CA may include a pixel group PG including at least one auxiliary sub-pixel Pa and a transmission area TA. As shown in the exemplary embodiment of FIG. 5, the pixel group PG and the transmission area TA may be alternately arranged in the x-axis direction and the y-axis direction, and may be arranged, for example, in a lattice shape. However, exemplary embodiments of the present inventive concepts are not limited thereto. As shown in the exemplary embodiment of FIG. 5, the component area CA may include a plurality of pixel groups PG and a plurality of transmission areas TA.

The pixel group PG may be defined as a sub-pixel aggregate in which a plurality of auxiliary sub-pixels Pa or main sub-pixels Pm are grouped in preset units. In the exemplary embodiments of FIGS. 5 and 6, one pixel group PG includes eight auxiliary sub-pixels Pa. In other words, in FIGS. 5 and 6, one pixel group PG includes a red sub-pixel Pr, a green sub-pixel Pg, a blue sub-pixel Pb, and a green sub-pixel Pg, which are arranged in the x-axis direction in a first row, and a blue sub-pixel Pb, a green sub-pixel Pg, a red sub-pixel Pr, and a green sub-pixel Pg, which are arranged in parallel in the x-axis direction in a second row different from the first row. However, exemplary embodiments of the present inventive concepts are not limited thereto. For example, the number or arrangement of auxiliary sub-pixels Pa included in the pixel group PG may be modified according to the resolution of the component area CA. In addition, it may be understood that one pixel group PG shown in FIG. 5 does not mean one pixel and includes a plurality of pixels. Also, as shown in the exemplary embodiment of FIG. 4, the pixel group PG may be defined in the same manner for the main sub-pixels Pm in the main display area MDA. The description of the pixel group PG of the auxiliary sub-pixels Pa, which will be described later, may also be applied to the pixel group PG of the main sub-pixels Pm. However, exemplary embodiments of the present inventive concepts are not limited thereto and in some exemplary embodiments, a pixel group PG for the main sub-pixels Pm may have different numbers of sub-pixels or a different arrangement of sub-pixels than a pixel group PG for the auxiliary sub-pixels Pa.

As described above, the pixel group PG may include eight auxiliary sub-pixels Pa, and FIG. 5 illustrates that the auxiliary sub-pixels Pa are arranged in a pentile type. However, the auxiliary sub-pixels Pa may be arranged in a stripe shape or other various shapes.

The transmission area TA may be arranged on one side of the pixel group PG. For example, as shown in the exemplary embodiment of FIG. 5, a plurality of transmission areas TA and a plurality of pixel groups PG are alternately arranged in a lattice shape. However, as shown in FIG. 6, a plurality of transmission areas TA may be arranged to surround one pixel group PG. In this embodiment, transmission areas TA may be adjacent to each other in the x and/or y direction and the transmission areas TA and pixel groups PG are not arranged in a lattice shape.

The transmission area TA is a part in which at least some of components included in the auxiliary sub-pixel Pa are not arranged in the component area CA. For example, in the transmission area TA, at least some of a pixel electrode included in the organic light-emitting diode OLED, an intermediate layer including an emission layer, and an opposite electrode, or at least a portion of a pixel circuit electrically connected to the organic light-emitting diode OLED may not be arranged. Some of the signal lines DL, SL, and EL (see FIG. 3) connected to supply signals to the auxiliary sub-pixel Pa located in the component area CA may be arranged to cross the transmission area TA. However, even in this embodiment the signal lines DL, SL, and EL may be arranged to be biased toward the edge of the transmission area TA, not the center of the transmission area TA to increase light/sound transmittance in the transmission area TA.

Although not illustrated in the exemplary embodiments of FIGS. 5 and 6, a metal layer may be arranged on the substrate 100 to correspond to the pixel group PG of the component area CA. The metal layer may be arranged, for example, between a thin-film transistor TFT of the auxiliary sub-pixel Pa and the substrate 100 (e.g., in the z direction). The metal layer may block light emitted from the component 20 or external light directed to the component 20 from entering a pixel circuit PC (see FIGS. 7 and 8) of the auxiliary sub-pixel Pa. In addition, the metal layer may prevent diffraction of light due to a fine gap between a wiring line and another wiring line, or reduce the degree of diffraction of light. A constant voltage or a signal may be applied to the metal layer to prevent damage to the pixel circuit PC due to electrostatic discharge. In an exemplary embodiment, a plurality of metal layers may be arranged in the component area CA, and in some cases, different voltages may be applied to at least one of the plurality of metal layers. A single metal layer in the form of a lattice may be located in the component area CA.

Figure 7:
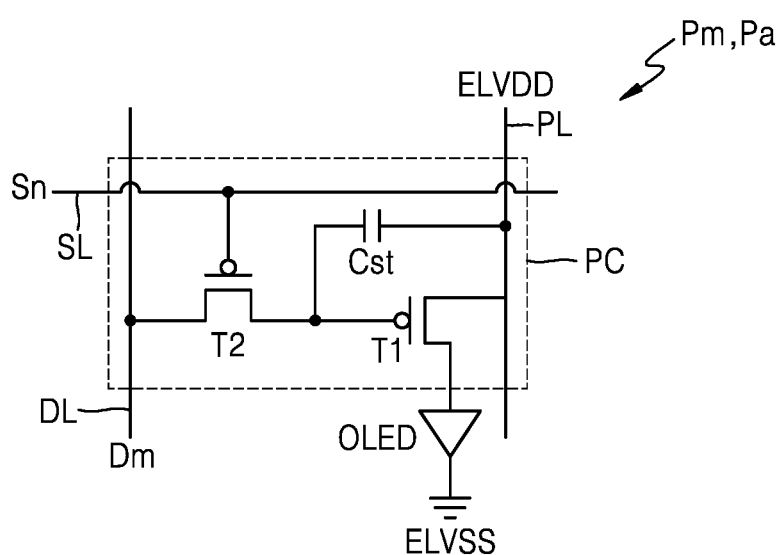
FIGS. 7 and 8 are equivalent circuit diagrams of a pixel circuit of a sub-pixel in the display panel of FIG. 3 according to exemplary embodiments of the present inventive concepts.
Figure 8:
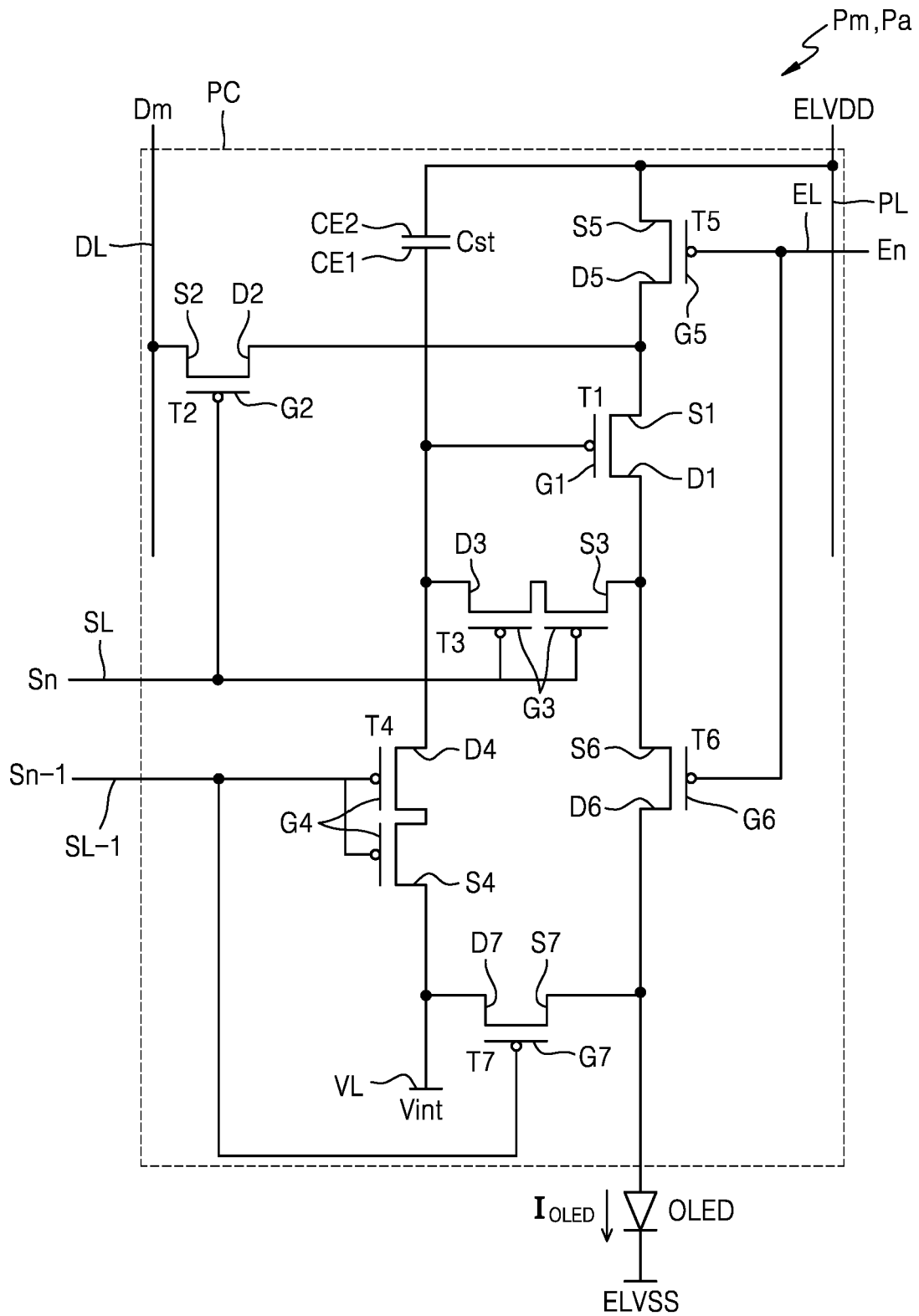

FIGS. 7 and 8 are equivalent circuit diagrams of a pixel circuit PC of a sub-pixel in the display panel 10 of FIG. 3 according to an exemplary embodiment of the present inventive concepts.

Referring to the exemplary embodiment of FIG. 7, each main sub-pixel Pm or auxiliary sub-pixel Pa includes a pixel circuit PC electrically connected to a scan line SL and a data line DL, and an organic light-emitting diode OLED electrically connected to the pixel circuit PC.

The pixel circuit PC includes a driving thin-film transistor T1, a switching thin-film transistor T2, and a storage capacitor Cst. The switching thin-film transistor T2 is electrically connected to the scan line SL and the data line DL, and is configured to transmit, to the driving thin-film transistor T1, a data signal Dm received via the data line DL according to a scan signal Sn received via the scan line SL.

The storage capacitor Cst is electrically connected to the switching thin-film transistor T2 and a driving voltage line PL. The storage capacitor Cst stores a voltage corresponding to a difference between a voltage received from the switching thin-film transistor T2 and a driving voltage ELVDD supplied to the driving voltage line PL.

The driving thin-film transistor T1 is electrically connected to the driving voltage line PL and the storage capacitor Cst, and may control a driving current flowing from the driving voltage line PL to the organic light-emitting diode OLED, in accordance with a voltage stored in the storage capacitor Cst. The organic light-emitting diode OLED may emit light having a certain brightness based on the magnitude of the driving current.

Although the pixel circuit PC shown in the exemplary embodiment of FIG. 7 includes two thin-film transistors and one storage capacitor, exemplary embodiments of the present inventive concepts are not limited thereto. For example, as shown in the exemplary embodiment of FIG. 8, the pixel circuit PC may include seven thin-film transistors and one storage capacitor. Although the pixel circuit PC shown in the exemplary embodiment of FIG. 7 includes one storage capacitor, in other exemplary embodiments the pixel circuit PC may include two or more storage capacitors. Furthermore, while the driving thin-film transistor T1 and the switching thin-film transistor T2 shown in the exemplary embodiment of FIG. 7 each have single gate electrodes, in other exemplary embodiments, at least one of the transistors may have dual gate electrodes, etc.

Referring to the exemplary embodiment of FIG. 8, each main sub-pixel Pm or auxiliary sub-pixel Pa includes a pixel circuit PC and an organic light-emitting diode OLED electrically connected to the pixel circuit PC. The pixel circuit PC may include a plurality of thin-film transistors and a storage capacitor Cst. The thin-film transistors and the storage capacitor Cst may be electrically connected to signal lines such as a scan line SL, a previous scan line SL−1, an emission control line EL, and a data line DL. The thin-film transistors and the storage capacitor Cst may also be electrically connected to an initializing voltage line VL and a driving voltage line PL.

Although each main sub-pixel Pm or auxiliary sub-pixel Pa is electrically connected to the signal lines, the initializing voltage line VL, and the driving voltage line PL in the exemplary embodiment of FIG. 8, exemplary embodiments of the present inventive concepts are not limited thereto. For example, at least one of the signal lines, the initializing voltage line VL, or the driving voltage line PL may be shared by neighboring sub-pixels.

The signal lines include a scan line SL that is configured to transmit a scan signal Sn, a previous scan line SL−1 that transmits a previous scan signal Sn−1 to a first initializing thin-film transistor T4 and a second initializing thin-film transistor T7, an emission control line EL that transmits an emission control signal En to an operation control thin-film transistor T5 and an emission control thin-film transistor T6, and a data line DL that intersects with the scan line SL and transmits a data signal Dm. The driving voltage line PL is configured to transmit a driving voltage ELVDD to a driving thin-film transistor T1, and the initializing voltage line VL transmits an initializing voltage Vint, which initializes the driving thin-film transistor T1 and a pixel electrode of the organic light-emitting diode OLED, to the first initializing thin-film transistor T4 and the second initializing thin-film transistor T7.

The driving thin-film transistor T1 includes a driving gate electrode G1 connected to a lower electrode CE1 of the storage capacitor Cst, a driving source electrode S1 connected to the driving voltage line PL via the operation control thin-film transistor T5, and a driving drain electrode D1 electrically connected to the pixel electrode of the organic light-emitting diode OLED via the emission control thin-film transistor T6. The driving thin-film transistor T1 receives the data signal Dm according to a switching operation of a switching thin-film transistor T2 and supplies a driving current $I_{OLED}$ to the organic light-emitting diode OLED.

The switching thin-film transistor T2 includes a switching gate electrode G2 connected to the scan line SL, a switching source electrode S2 connected to the data line DL, and a switching drain electrode D2 connected to the driving source electrode S1 of the driving thin-film transistor T1 and also connected to the driving voltage line PL via the operation control thin-film transistor T5. The switching thin-film transistor T2 is turned on according to the scan signal Sn received via the scan line SL and performs a switching operation of transmitting the data signal Dm received from the data line DL to the driving source electrode S1 of the driving thin-film transistor T1.

A compensating thin-film transistor T3 includes a compensating gate electrode G3 connected to the scan line SL, a compensating source electrode S3 connected to the driving drain electrode D1 of the driving thin-film transistor T1 and also connected to the pixel electrode of the organic light-emitting diode OLED via the emission control thin-film transistor T6, and a compensating drain electrode D3 connected to the lower electrode CE1 of the storage capacitor Cst, a first initializing drain electrode D4 of the first initializing thin-film transistor T4, and the driving gate electrode G1 of the driving thin-film transistor T1. The compensating thin-film transistor T3 is turned on according to the scan signal Sn received via the scan line SL and electrically connects the driving gate electrode G1 and the driving drain electrode D1 of the driving thin-film transistor T1 to each other, such that the driving thin-film transistor T1 is diode-connected. As shown in the exemplary embodiment of FIG. 8, the compensating gate electrode G3 may be a dual gate electrode.

The first initializing thin-film transistor T4 includes a first initializing gate electrode G4 connected to the previous scan line SL−1, a first initializing source electrode S4 connected to a second initializing drain electrode D7 of the second initializing thin-film transistor T7 and the initializing voltage line VL, and the first initializing drain electrode D4 connected to the lower electrode CE1 of the storage capacitor Cst, the compensating drain electrode D3 of the compensating thin-film transistor T3, and the driving gate electrode G1 of the driving thin-film transistor T1. The first initializing thin-film transistor T4 is turned on according to the previous scan signal Sn−1 received via the previous scan line SL−1 and is configured to transmit the initializing voltage Vint to the driving gate electrode G1 of the driving thin-film transistor T1 to thereby initialize a voltage of the driving gate electrode G1 of the driving thin-film transistor T1. As shown in the exemplary embodiment of FIG. 8, the first initializing thin-film transistor T4 may be a dual gate electrode.

The operation control thin-film transistor T5 includes an operation control gate electrode G5 connected to the emission control line EL, an operation control source electrode S5 connected to the driving voltage line PL, and an operation control drain electrode D5 connected to the driving source electrode S1 of the driving thin-film transistor T1 and the switching drain electrode D2 of the switching thin-film transistor T2.

The emission control thin-film transistor T6 includes an emission control gate electrode G6 connected to the emission control line EL, an emission control source electrode S6 connected to the driving drain electrode D1 of the driving thin-film transistor T1 and the compensating source electrode S3 of the compensating thin-film transistor T3, and an emission control drain electrode D6 electrically connected to a second initializing source electrode S7 of the second initializing thin-film transistor T7 and the pixel electrode of the organic light-emitting diode OLED.

The operation control thin-film transistor T5 and the emission control thin-film transistor T6 are simultaneously turned on according to the emission control signal En received via the emission control line EL, and thus, the driving voltage ELVDD is transmitted to the organic light-emitting diode OLED such that the driving current $I_{OLED}$ may flow in the organic light-emitting diode OLED.

The second initializing thin-film transistor T7 includes a second initializing gate electrode G7 connected to the previous scan line SL−1, the second initializing source electrode S7 connected to the emission control drain electrode D6 of the emission control thin-film transistor T6 and the pixel electrode of the organic light-emitting diode OLED, and the second initializing drain electrode D7 connected to the first initializing source electrode S4 of the first initializing thin-film transistor T4 and the initializing voltage line VL. The second initializing thin-film transistor T7 is turned on according to the previous scan signal Sn−1 received via the previous scan line SL−1 and initializes the pixel electrode of the organic light-emitting diode OLED.

Although the first initializing thin-film transistor T4 and the second initializing thin-film transistor T7 are connected to the previous scan line SL−1 in the exemplary embodiment of FIG. 8, exemplary embodiments of the present inventive concepts are not limited thereto. For example, in other exemplary embodiments, the first initializing thin-film transistor T4 may be connected to the previous scan line SL−1 and operate according to the previous scan signal Sn−1, and the second initializing thin-film transistor T7 may be connected to a separate signal line (e.g., a subsequent scan line, etc.) and operate according to a signal transmitted from the separate signal line.

An upper electrode CE2 of the storage capacitor Cst is connected to the driving voltage line PL, and an opposite electrode of the organic light-emitting diode OLED is connected to the second power supply voltage ELVSS. Accordingly, the organic light-emitting diode OLED may receive the driving current $I_{OLED}$ from the driving thin-film transistor T1 and emits light, thereby displaying an image.

Although each of the compensating thin-film transistor T3 and the first initializing thin-film transistor T4 has a dual gate electrode in the exemplary embodiment of FIG. 8, at least one of the compensating thin-film transistor T3 and the first initializing thin-film transistor T4 may have a single gate electrode in other exemplary embodiments.

Figure 9:
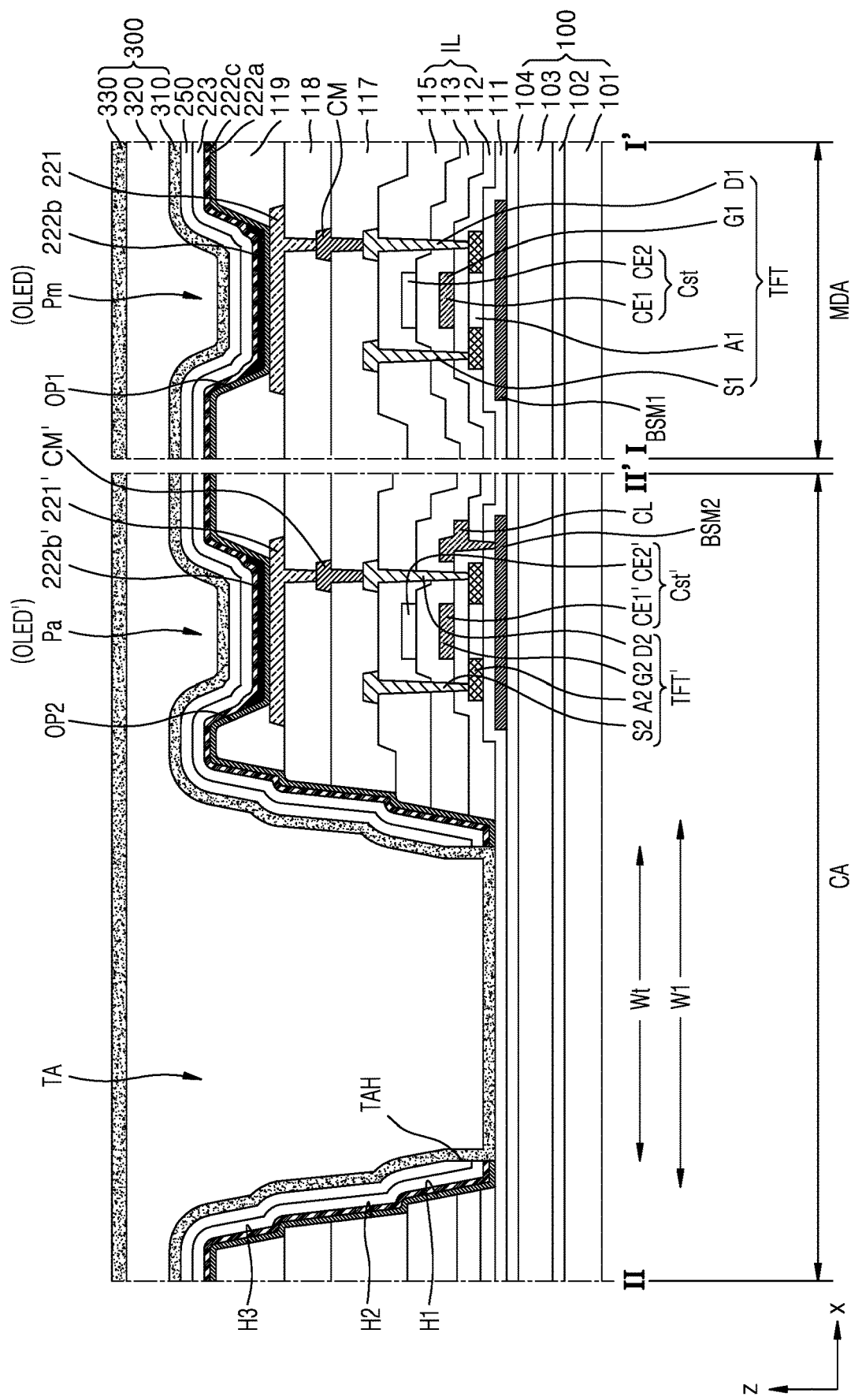
FIG. 9 is a cross-sectional view of a pixel arrangement structure taken along line I-I' of FIG. 4 and line II-II' of FIG. 6 according to an exemplary embodiment of the present inventive concepts.

FIG. 9 is a schematic cross-sectional view of a pixel arrangement structure taken along line I-I' of FIG. 4 and line II-II' of FIG. 6 according to an exemplary embodiment of the present inventive concepts.

As described above, a display panel 10 includes a main display area MDA and a component area CA. A plurality of main sub-pixels Pm is arranged in the main display area MDA, and a plurality of auxiliary sub-pixels Pa is arranged in the component area CA. The component area CA includes a transmission area TA.

The main sub-pixel Pm may include a main thin-film transistor TFT, a main storage capacitor Cst, and an organic light-emitting diode OLED. The auxiliary sub-pixel Pa may include an auxiliary thin-film transistor TFT', an auxiliary storage capacitor Cst', and an organic light-emitting diode OLED'. The display panel 10 may have a transmission hole TAH corresponding to the transmission area TA.

A first metal layer BSM1 may be arranged under (e.g., in a −z direction) the main thin-film transistor TFT of the main sub-pixel Pm to overlap the main thin-film transistor TFT. A second metal layer BSM2 may be arranged under (e.g., in a −z direction) the auxiliary thin-film transistor TFT' of the auxiliary sub-pixel Pa to overlap the auxiliary thin-film transistor TFT'. However, exemplary embodiments of the present inventive concepts are not limited thereto and the display panel 10 may have various modifications. For example, the first metal layer BSM1 arranged to overlap the main thin-film transistor TFT may be omitted.

Hereinafter, a stacked structure of the display panel 10 will be described.

As described above, a substrate 100 may include a polymer resin. As shown in the exemplary embodiment of FIG. 9, the substrate 100 includes a first base layer 101, a first inorganic layer 102, a second base layer 103, and a second inorganic layer 104, which are sequentially stacked (e.g., in the z direction). The first base layer 101 and the second base layer 103 may each include a polymer resin as described above. Each of the first inorganic layer 102 and the second inorganic layer 104 is a barrier layer that prevents the penetration of impurities from the outside. In an exemplary embodiment, the first inorganic layer 102 and the second inorganic layer 104 may include an inorganic material, such as silicon nitride (SiNx), silicon oxide (SiOx), or silicon oxynitride (SiNO), and may have a single-layered structure or a multi-layered structure.

A buffer layer 111 may be disposed on the substrate 100 to prevent or reduce the penetration of impurities from the bottom of the substrate 100, and may also serve to provide a flat surface on the substrate 100 for planarization thereof. In an exemplary embodiment, the buffer layer 111 may include an inorganic material such as oxide or nitride, an organic material, or an organic-inorganic compound. The buffer layer 111 may have a single-layered structure or may have a multi-layered structure.

The first metal layer BSM1 and the second metal layer BSM2 as described above may be disposed between the substrate 100 and the buffer layer 111 (e.g., in the z direction). For example, the first metal layer BSM1 and the second metal layer BSM2 may be disposed directly between the second inorganic layer 104 and the buffer layer 111. However, exemplary embodiments of the present inventive concepts are not limited thereto, and in other exemplary embodiments, the first metal layer BSM1 and the second metal layer BSM2 may be disposed under the second inorganic layer 104. For example, the first metal layer BSM1 and the second metal layer BSM2 may be disposed directly between the second base layer 103 and the second inorganic layer 104. Alternatively, the first metal layer BSM1 and the second metal layer BSM2 may be arranged on different layers.

Each of the first metal layer BSM1 and the second metal layer BSM2 may be connected to a conductive line CL arranged on another layer through a contact hole. In an exemplary embodiment, a constant voltage or a signal may be applied from the conductive line CL to the first metal layer BSM1 and the second metal layer BSM2. For example, the driving voltage ELVDD or a scan signal may be applied to the first metal layer BSM1 and the second metal layer BSM2. By applying a constant voltage or a signal to the first metal layer BSM1 and the second metal layer BSM2, the probability that the pixel circuit PC is damaged by electrostatic discharge may be significantly reduced. However, exemplary embodiments of the present inventive concepts are not limited thereto and in other exemplary embodiments an electrical signal may not be applied to the first metal layer BSM1 and the second metal layer BSM2. In another exemplary embodiment, one of the first metal layer BSM1 and the second metal layer BSM2 may be electrically floated, and an electrical signal may be applied to the other one.

In an exemplary embodiment, each of the first metal layer BSM1 and the second metal layer BSM2 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu). In addition, the first metal layer BSM1 and the second metal layer BSM2 may each have a single-layered structure or a multi-layered structure.

The main thin-film transistor TFT and the auxiliary thin-film transistor TFT' may be disposed on the buffer layer 111. For example, as shown in the exemplary embodiment of FIG. 9, the main thin-film transistor TFT and the auxiliary thin-film transistor TFT' are disposed directly on the buffer layer 111. The main thin-film transistor TFT includes a first semiconductor layer A1, a first gate electrode G1, a first source electrode S1, and a first drain electrode D1. The auxiliary thin-film transistor TFT' includes a second semiconductor layer A2, a second gate electrode G2, a second source electrode S2, and a second drain electrode D2. The main thin-film transistor TFT may be electrically connected to the organic light-emitting diode OLED of a main sub-pixel Pm in the main display area MDA to drive the organic light-emitting diode OLED. The auxiliary thin-film transistor TFT' may be electrically connected to the organic light-emitting diode OLED' of an auxiliary sub-pixel Pa in the component area CA to drive the organic light-emitting diode OLED'.

In an exemplary embodiment, the first semiconductor layer A1 and the second semiconductor layer A2 may be disposed on the buffer layer 111 and may each include polysilicon or amorphous silicon. However, exemplary embodiments of the present inventive concepts are not limited thereto. For example, in another exemplary embodiment, each of the first semiconductor layer A1 and the second semiconductor layer A2 may include oxide of at least one material selected from indium (In), gallium (Ga), stannium (Sn), zirconium (Zr), vanadium (V), hafnium (Hf), Cadmium (Cd), germanium (Ge), chromium (Cr), titanium (Ti), and zinc (Zn). Each of the first semiconductor layer A1 and the second semiconductor layer A2 may include a channel region, and a source region and a drain region doped with impurities.

The first semiconductor layer A1 may overlap the first metal layer BSM1 (e.g., in the z direction) with the buffer layer 111 therebetween. The area of the first semiconductor layer A1 (e.g., in a plane defined by the x and y directions) may be less than an area of the first metal layer BSM1, and thus, when viewed in a direction (e.g., the −z direction) perpendicular to the substrate 100, the entire portion of the first semiconductor layer A1 may overlap the first metal layer BSM1.

The second semiconductor layer A2 may overlap the second metal layer BSM2 (e.g., in the z direction) with the buffer layer 111 therebetween. The area of the second semiconductor layer A2 (e.g., in a plane defined by the x and y directions) may be less than the area of the second metal layer BSM2, and thus, when viewed in a direction (e.g., the −z direction) perpendicular to the substrate 100, the entire portion of the second semiconductor layer A2 may overlap the second metal layer BSM2.

A first gate insulating layer 112 covers the first semiconductor layer A1 and the second semiconductor layer A2. For example, as shown in the exemplary embodiment of FIG. 9, a lower surface of the first gate insulating layer 112 may be disposed directly on upper surfaces of the buffer layer 111, the first semiconductor layer A1 and the second semiconductor layer A2. In an exemplary embodiment, the first gate insulating layer 112 may include an inorganic insulating material, such as at least one compound selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first gate insulating layer 112 may have a single-layered structure or may have a multi-layered structure.

The first gate electrode G1 and the second gate electrode G2 are arranged on the first gate insulating layer 112 to overlap (e.g., in the z direction) the first semiconductor layer A1 and the second semiconductor layer A2, respectively. In an exemplary embodiment, each of the first gate electrode G1 and the second gate electrode G2 may include Mo, Al, Cu, Ti, and the like and may have a single-layered structure or a multi-layered structure. For example, each of the first gate electrode G1 and the second gate electrode G2 may have a single-layered structure including Mo.

A second gate insulating layer 113 covers the first gate electrode G1 and the second gate electrode G2. For example, as shown in the exemplary embodiment of FIG. 9, a lower surface of the second gate insulating layer 113 may directly contact upper surfaces of the first gate insulating layer 112, the first gate electrode G1 and the second gate electrode G2. In an exemplary embodiment, the second gate insulating layer 113 may include an inorganic insulating material, such as at least one compound selected from $SiO_2$, $SiN_x$, SiON, $Al_2O_3$, $TiO_2$, $Ta_2O_5$, $HfO_2$, and $ZnO_2$. The second gate insulating layer 113 may have a single-layered structure or a multi-layered structure.

A first upper electrode CE2 of the main storage capacitor Cst and a second upper electrode CE2' of the auxiliary storage capacitor Cst' may be disposed on the second gate insulating layer 113. For example, as shown in the exemplary embodiment of FIG. 9, lower surfaces of the first upper electrode CE2 and second upper electrode CE2 may directly contact upper surfaces of the second gate insulating layer 113.

In the main display area MDA, the first upper electrode CE2 may overlap (e.g., in the z direction) the first gate electrode G1 thereunder. The first gate electrode G1 and the first upper electrode CE2 overlapping each other with the second gate insulating layer 113 therebetween may form the main storage capacitor Cst. As shown in the exemplary embodiment of FIG. 9, the first gate electrode G1 may be the first lower electrode CE1 of the main storage capacitor Cst. In the component area CA, the second upper electrode CE2' may overlap (e.g., in the z direction) the second gate electrode G2 thereunder. The second gate electrode G2 and the second upper electrode CE2 overlapping each other with the second gate insulating layer 113 therebetween may form the auxiliary storage capacitor Cst'. As shown in the exemplary embodiment of FIG. 9, the first gate electrode G1 may be the second lower electrode CE1' of the auxiliary storage capacitor Cst'.

In an exemplary embodiment, each of the first upper electrode CE2 and the second upper electrode CE2' may include at least one compound selected from Al, Pt, Pd, Ag, Mg, Au, Ni, Nd, Ir, Cr, Li, Ca, Mo, Ti, W, and Cu, and may have a single-layered structure or a multi-layered structure.

An interlayer insulating layer 115 may be formed to cover the first upper electrode CE2 and the second upper electrode CE2'. For example, as shown in the exemplary embodiment of FIG. 9, a lower surface of the interlayer insulating layer 115 may directly contact upper surfaces of the first upper electrode CE2, the second upper electrode CE2' and the second gate insulating layer 113. In an exemplary embodiment, the interlayer insulating layer 115 may include at least one compound selected from $SiO_2$, $SiN_x$, SiON, $Al_2O_3$, $TiO_2$, $Ta_2O_5$, $HfO_2$, $ZnO_2$, and the like.

The first gate insulating layer 112, the second gate insulating layer 113, and the interlayer insulating layer 115 are collectively referred to as an inorganic insulating layer IL. The inorganic insulating layer IL may have a first hole H1 corresponding to the transmission area TA. The first hole H1 may expose a portion of the upper surface of the buffer layer 111 or the substrate 100. The first hole H1 may be formed by overlapping an opening of the first gate insulating layer 112, an opening of the second gate insulating layer 113, and an opening of the interlayer insulating layer 115, which are formed to correspond to the transmission area TA. The openings may be separately formed through separate processes, or may be simultaneously formed through the same process. When the openings are formed through separate processes, the inner surface of the first hole H1 is not smooth and may have stair-shaped steps.

However, in other exemplary embodiments, the inorganic insulating layer IL may have a groove rather than the first hole H1 that exposes the buffer layer 111. Alternatively, the inorganic insulating layer IL may not have a first hole H1 or groove corresponding to the transmission area TA. The inorganic insulating layer IL includes an inorganic insulating material having generally excellent light transmittance and thus has sufficient transmittance even if it does not have a hole or groove corresponding to the transmission area TA. Therefore, the component 20 (see FIG. 2) may transmit/receive a sufficient amount of light even in embodiments in which a first hole H1 or groove is not included in the inorganic insulating layer IL.

The first and second source electrodes S1 and S2 and the first and second drain electrodes D1 and D2 are arranged on the interlayer insulating layer 115. Each of the first and second source electrodes S1 and S2 and each of the first and second drain electrodes D1 and D2 may include a conductive material including Mo, Al, Cu, Ti, and the like and may have a multi-layered structure or a single-layered structure. For example, each of the first and second source electrodes S1 and S2 and each of the first and second drain electrodes D1 and D2 may have a multi-layered structure of Ti/Al/Ti.

A first planarization layer 117 covers the first and second source electrodes S1 and S2 and the first and second drain electrodes D1 and D2. For example, as shown in the exemplary embodiment of FIG. 9, a lower surface of the first planarization layer 117 may directly contact upper surfaces of the first and second source electrodes S1 and S2 and the interlayer insulating layer 115. The first planarization layer 117 may have an upper surface having a substantially flat shape (e.g., substantially extending along an xy plane). A second planarization layer 118 may be disposed on the first planarization layer 117 (e.g., directly on the first planarization layer 117 in the z direction). Contact metal layers CM and CM' may be arranged between the first planarization layer 117 and the second planarization layer 118 (e.g., in the z direction). The contact metal layers CM and CM' may electrically connect a first pixel electrode 221 and a second pixel electrode 221' to corresponding first and second drain electrodes D1 and D2 through contact holes formed in the first planarization layer 117 and the second planarization layer 118, respectively.

In an exemplary embodiment, each of the first planarization layer 117 and the second planarization layer 118 may include an organic material or an inorganic material and may have a single-layered structure or a multi-layered structure. For example, each of the first planarization layer 117 and the second planarization layer 118 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, a blend thereof, or the like. In an exemplary embodiment, each of the first planarization layer 117 and the second planarization layer 118 may include at least one compound selected from $SiO_2$, $SiN_x$, SiON, $Al_2O_3$, $TiO_2$, $Ta_2O_5$, $HfO_2$, $ZnO_2$, and the like. In an exemplary embodiment, when forming the first planarization layer 117 and the second planarization layer 118, chemical mechanical polishing may be performed on the top surface of each layer to provide a flat top surface after each layer is formed.

The first planarization layer 117 and the second planarization layer 118 may have a second hole H2 corresponding to the transmission area TA. The second hole H2 may overlap the first hole H1 (e.g., in the z direction). In the exemplary embodiment of FIG. 9, the area of the second hole H2 is larger than the area of the first hole H1 (e.g., in a plane defined in the x and y directions). However, exemplary embodiments of the present inventive concepts are not limited thereto. For example, in another exemplary embodiment, the first planarization layer 117 and the second planarization layer 118 may be disposed on lateral edges of the first hole H1 of the inorganic insulating layer IL to cover the edges of the first hole H1, and thus, the area of the second hole H2 may be less than the area of the first hole H1.

The first planarization layer 117 and the second planarization layer 118 may have openings exposing one of the first source electrode S1 and the first drain electrode D1 of the main thin-film transistor TFT, and the first pixel electrode 221 may be electrically connected to the main thin-film transistor TFT by contacting the first source electrode S1 or the first drain electrode D1 through the openings. In addition, the first planarization layer 117 and the second planarization layer 118 may have openings exposing one of the second source electrode S2 and the second drain electrode D2 of the auxiliary thin-film transistor TFT', and the second pixel electrode 221' may be electrically connected to the auxiliary thin-film transistor TFT' by contacting the second source electrode S2 or the second drain electrode D2 through the openings.

In an exemplary embodiment, each of the first pixel electrode 221 and the second pixel electrode 221' may include a conductive oxide, such as at least one compound selected from indium tin oxide (ITO), indium zinc oxide (IZO), zinc oxide (ZnO), indium oxide ($In_2O_3$), indium gallium oxide (IGO), and aluminum zinc oxide (AZO). Each of the first pixel electrode 221 and the second pixel electrode 221' may include a reflective layer including Ag, Mg, Al, Pt, Pd, Au, Ni, Nd, Ir, Cr, or a compound thereof. For example, each of the first pixel electrode 221 and the second pixel electrode 221' may have a structure including a layer including ITO, IZO, ZnO, or $In_2O_3$ above or below the reflective layer. In this embodiment, each of the first pixel electrode 221 and the second pixel electrode 221' may have a stacked structure of ITO/Ag/ITO.

A pixel-defining layer 119 may cover the lateral edges of each of the first pixel electrode 221 and the second pixel electrode 221'. The pixel-defining layer 119 has a first opening OP1 and a second opening OP2, which overlap the first pixel electrode 221 and the second pixel electrode 221', respectively, and define an emission area of a sub-pixel. The pixel-defining layer 119 increases the distance between the edges of the first and second pixel electrodes 221 and 221' and an opposite electrode 223 thereon, thereby preventing the occurrence of arcs in the edges of the first and second pixel electrodes 221 and 221'. In an exemplary embodiment, the pixel-defining layer 119 may include an organic insulating material such as at least one compound selected from polyimide, polyamide, acrylic resin, BCB, HMDSO, or phenol resin and may be formed by spin coating or the like.

The pixel-defining layer 119 may have a third hole H3 located in the transmission area TA. The third hole H3 may overlap the first hole H1 and the second hole H2. As shown in the exemplary embodiment of FIG. 9, the area of the third hole H3 (e.g., in a plane defined in the x and y directions) may be larger than the area of the second hole H2. However, exemplary embodiments of the present inventive concepts are not limited thereto. The light transmittance in the transmission area TA may be improved by the first hole H1 to the third hole H3. A portion of the opposite electrode 223, which will be described later, may be arranged on the inner surface of the first hole H1 to the third hole H3.

A first intermediate layer 222a is arranged to cover the pixel-defining layer 119. The first intermediate layer 222a may have a single-layered structure or a multi-layered structure. The first intermediate layer 222a may include a hole transport layer (HTL) having a single-layered structure. Alternatively, the first intermediate layer 222a may include a hole injection layer (HIL) and an HTL. The first intermediate layer 222a may be integrally formed in the main sub-pixels Pm and the auxiliary sub-pixels Pa respectively included in the main display area MDA and the component area CA.

A first emission layer 222b and a second emission layer 222b' respectively corresponding to the first pixel electrode 221 and the second pixel electrode 221' are arranged on the first intermediate layer 222a. In an exemplary embodiment, each of the first emission layer 222b and the second emission layer 222b' may include a polymer material or a low molecular material and may emit red, green, blue, or white light.

A second intermediate layer 222c may be located on the first emission layer 222b and the second emission layer 222b'. The second intermediate layer 222c may have a single-layered structure or a multi-layered structure. The second intermediate layer 222c may include an electron transport layer (ETL) and/or an electron injection layer (EIL). The second intermediate layer 222c may be integrally formed in the main sub-pixels Pm and the auxiliary sub-pixels Pa respectively included in the main display area MDA and the component area CA. However, exemplary embodiments of the present inventive concepts are not limited thereto and in some exemplary embodiments the display panel 10 may not include at least one of the first intermediate layer 222a and the second intermediate layer 222c.

The opposite electrode 223 is disposed on the second intermediate layer 222c. The opposite electrode 223 may include a conductive material having a low work function. For example, in an exemplary embodiment, the opposite electrode 223 may include a (semi) transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or $In_2O_3$ on the (semi) transparent layer including the aforementioned material. The opposite electrode 223 may be integrally formed to correspond to the main sub-pixels Pm and the auxiliary sub-pixels Pa respectively arranged in the main display area MDA and the component area CA.

Layers from the first pixel electrode 221 to the opposite electrode 223, which are formed in the main display area MDA, may form a main organic light-emitting diode OLED. Layers from the second pixel electrode 221' to the opposite electrode 223, which are formed in the component area CA, may form an organic light-emitting diode OLED'.

A capping layer 250 may be disposed on the opposite electrode 223 (e.g., directly disposed thereon in the z direction). In an exemplary embodiment, the capping layer 250 may include LiF. Alternatively, the capping layer 250 may include an inorganic insulating material such as silicon nitride, and/or an organic insulating material. However, exemplary embodiments of the present inventive concepts are not limited thereto and in some exemplary embodiment, the display panel 10 may not include the capping layer 250.

The first intermediate layer 222a, the second intermediate layer 222c, the opposite electrode 223, and the capping layer 250 may have a transmission hole TAH corresponding to the transmission area TA. For example, the first intermediate layer 222a, the second intermediate layer 222c, the opposite electrode 223, and the capping layer 250 may respectively have openings corresponding to the transmission area TA which collectively form the transmission hole TAH. In an exemplary embodiment, the areas of the openings of the first intermediate layer 222a, the second intermediate layer 222c, the opposite electrode 223, and the capping layer 250 may be substantially the same. The area of the opening of the opposite electrode 223 may be substantially the same as the area of the transmission hole TAH. However, exemplary embodiments of the present inventive concepts are not limited thereto. For example, in another exemplary embodiment, the area (e.g., in a plane defined in the x and y directions) of the opening of the first intermediate layer 222a, the area of the opening of the second intermediate layer 222c, the area of the opening of the opposite electrode 223, and the area of the opening of the capping layer 250 may not be the same, and the area of any one of the openings may be less or greater than the areas of the other openings. For example, the inner surface of the opening of the first intermediate layer 222a may be located in the transmission hole TAH, and thus, a portion defining the opening of the first intermediate layer 222a may have a shape protruding into the transmission hole TAH.

The correspondence of the transmission hole TAH to the transmission area TA means that the transmission hole TAH overlaps the transmission area TA. In an exemplary embodiment, the area of the transmission hole TAH may be less than the area of the first hole H1 formed in the inorganic insulating layer IL. For example, as shown in the exemplary embodiment of FIG. 9, a width Wt (e.g., length in the x direction) of the transmission hole TAH is less than a width W1 (e.g., length in the x direction) of the first hole H1. In this embodiment, the area of the transmission hole TAH may be defined by an opening having the smallest size from among overlapping openings of layers located in a transmission portion from among layers of a panel. The area of the first hole H1 may also be defined as the area of an opening having the smallest area from among openings constituting the first hole H1.

Due to the transmission hole TAH, a portion of the opposite electrode 223 does not exist in the transmission area TA, and thus, the light transmittance in the transmission area TA may be significantly improved. The opposite electrode 223 may be formed in various ways. For example, the opposite electrode 223 with openings may be formed by forming a layer, with a material for the opposite electrode 223, and then removing a portion corresponding to the transmission area TA through laser lift off. Alternatively, the opposite electrode 223 having openings may be formed through fine metal mask patterning. However, exemplary embodiments of the present inventive concepts are not limited thereto.

The organic light-emitting diode OLED in the main display area MDA and the organic light-emitting diode OLED' in the component area CA may be sealed by a thin-film encapsulation layer 300. The thin-film encapsulation layer 300 may be disposed on the capping layer 250. For example, as shown in the exemplary embodiment of FIG. 9, a lower surface of the thin-film encapsulation layer 300 may directly contact an upper surface of the capping layer 250. The thin-film encapsulation layer 300 may prevent external moisture or foreign matter from penetrating into the organic light-emitting diode OLED and the organic light-emitting diode OLED'.

The thin-film encapsulation layer 300 may include at least one inorganic encapsulation layer and at least one organic encapsulation layer. In the exemplary embodiment shown in FIG. 9, the thin-film encapsulation layer 300 has a structure in which a first inorganic encapsulation layer 310, an organic encapsulation layer 320, and a second inorganic encapsulation layer 330 are consecutively stacked (e.g., in the z direction). However, exemplary embodiments of the present inventive concepts are not limited thereto and in other exemplary embodiments, the number of organic encapsulation layers, the number of inorganic encapsulation layers, and the stacking order may be changed.

In an exemplary embodiment, each of the first inorganic encapsulation layer 310 and the second inorganic encapsulation layer 330 may include one or more inorganic insulating materials, such as aluminum oxide, titanium oxide, tantalum oxide, hafnium oxide, zinc oxide, silicon oxide, silicon nitride, and/or silicon oxynitride, and may be formed by chemical vapor deposition (CVD). The organic encapsulation layer 320 may include a polymer-based material. Examples of the polymer-based material may include silicon-based resin, acryl-based resin, epoxy-based resin, polyimide, and polyethylene. However, exemplary embodiments of the present inventive concepts are not limited thereto.

The first inorganic encapsulation layer 310, the organic encapsulation layer 320, and the second inorganic encapsulation layer 330 may be integrally formed to cover the main display area MDA and the component area CA. Accordingly, the first inorganic encapsulation layer 310, the organic encapsulation layer 320, and the second inorganic encapsulation layer 330 may be arranged also in the transmission hole TAH. For example, as shown in the exemplary embodiment of FIG. 9, a lower surface of the first inorganic encapsulation layer 310 may directly contact an upper surface of the buffer layer 111 in the transmission hole TAH and the organic encapsulation layer 320 and the second inorganic encapsulation layer 330 are consecutively stacked thereon. However, exemplary embodiments of the present inventive concepts are not limited thereto. For example, in some exemplary embodiments, the organic encapsulation layer 320 may be integrally formed to cover the main display area MDA and the component area CA, but may not be disposed in the transmission area TA. For example, the organic encapsulation layer 320 may have an opening corresponding to the transmission area TA. In this embodiment, the first inorganic encapsulation layer 310 and the second inorganic encapsulation layer 330 may directly contact each other in the transmission hole TAH.

Figure 10:
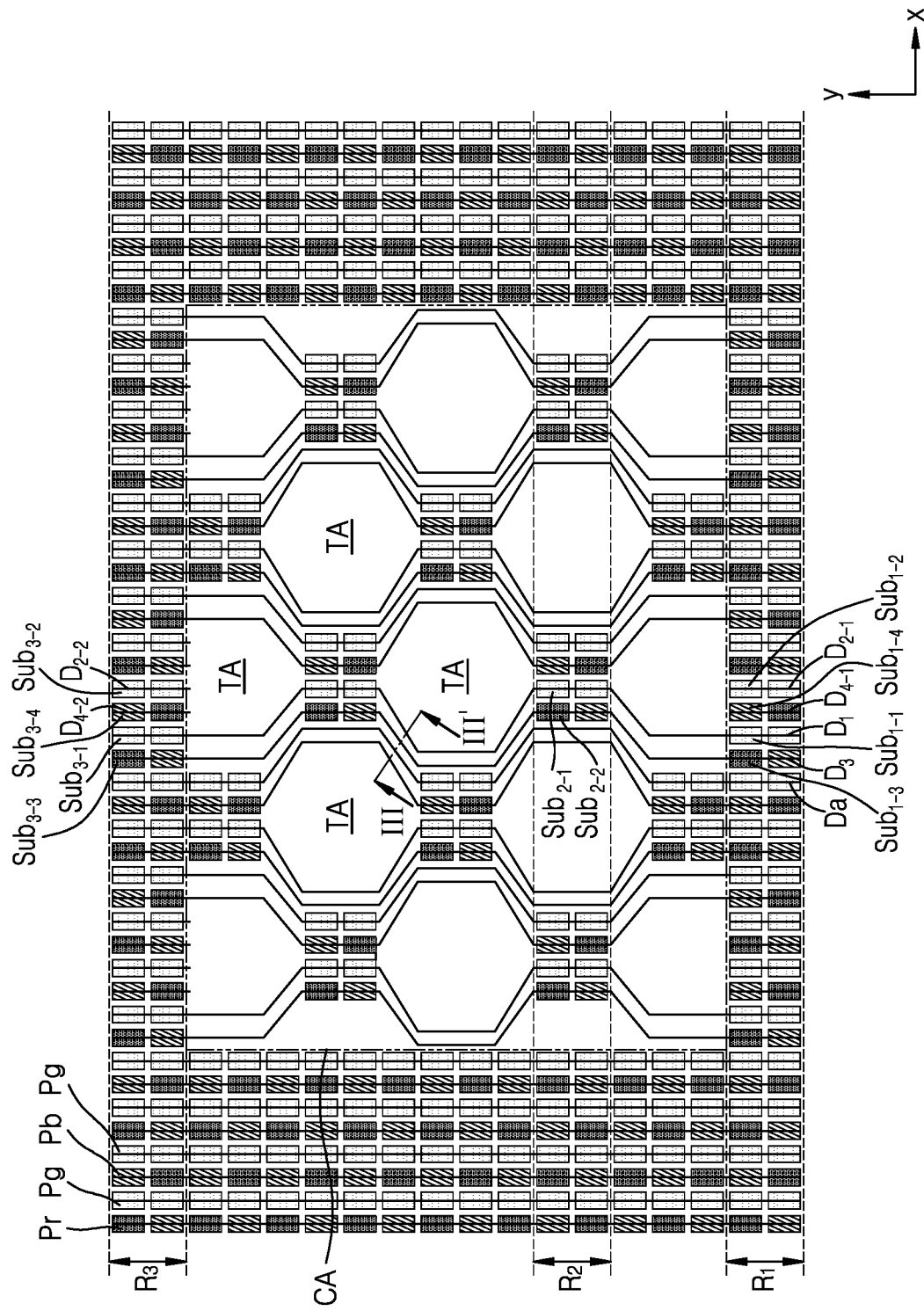
FIGS. 10 and 11 are plan views illustrating an arrangement of sub-pixels and wiring lines of the display panel of FIG. 3 according to an exemplary embodiment of the present inventive concepts.
Figure 11:
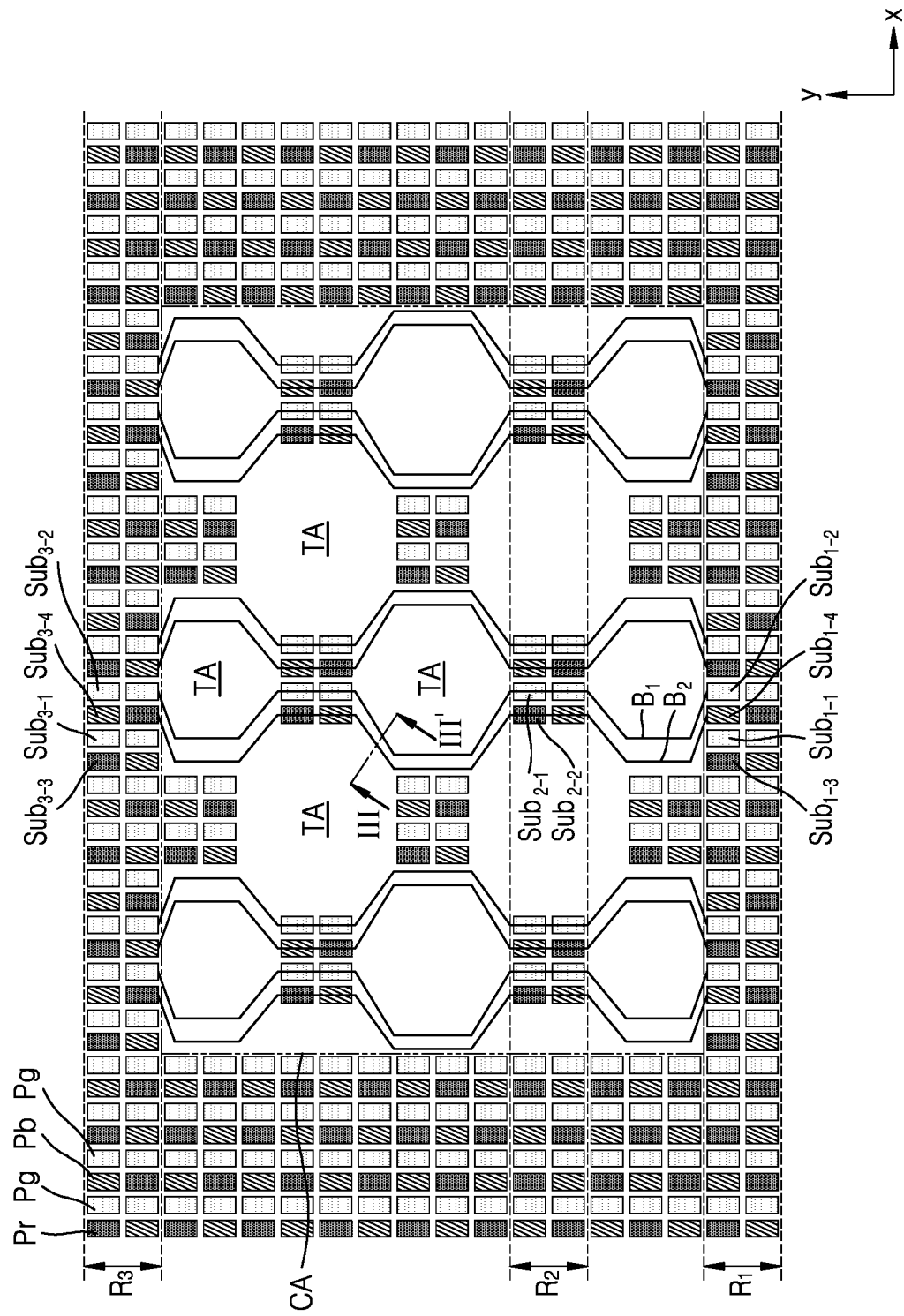

FIGS. 10 and 11 are schematic plan views illustrating an arrangement of sub-pixels and wiring lines of the display panel 10 of FIG. 3 according to exemplary embodiments of the present inventive concepts. Since the plan views show only a portion of the display panel 10, more sub-pixels are omitted. Also, since the plan views show only wiring lines necessary for description, more wiring lines are omitted for convenience of explanation. The plan views show portions of the component area CA and the main display area MDA outside the component area CA. The arrangement of sub-pixels and wiring lines shown in the exemplary embodiment of FIG. 10 includes a first data line $D_1$, a 2-$1^{st}$ data line $D_{2-1}$, a 2-$2^{nd}$ data line $D_{2-2}$, a third data line $D_3$, a 4-$1^{st}$ data line $D_{4-1}$, and a 4-$2^{nd}$ data line $D_{4-2}$ among wiring lines. The arrangement of sub-pixels shown in the exemplary embodiment of FIG. 11 illustrates a first bridge line $B_1$ and a second bridge line $B_2$ among the wiring lines. In the exemplary embodiments of FIGS. 10 and 11, the first data line $D_1$, the 2-$1^{st}$ data line $D_{2-1}$, the 2-$2^{nd}$ data line $D_{2-2}$, the third data line $D_3$, the 4-$1^{st}$ data line $D_{4-1}$, the 4-$2^{nd}$ data line $D_{4-2}$, the first bridge line $B_1$, and the second bridge line $B_2$ are illustrated as passing through the centers of sub-pixels for convenience of illustration. However, the wiring lines may be modified in various ways, such as passing through the edges of sub-pixels, etc. The wiring lines shown in the drawings in connection with exemplary embodiments and modifications thereof described below may also be modified in various ways and are not limited by the illustrations thereof.

As shown in the exemplary embodiments of FIGS. 10 and 11, sub-pixels are arranged in a plurality of rows extending in the x-axis direction. A 1-$1^{st}$ sub-pixel $Sub_{1-1}$ and a 1-$2^{nd}$ sub-pixel $Sub_{1-2}$ are located in a first row $R_1$ that is positioned adjacent to a lower side (e.g., in the y direction) of the component area CA. The first row $R_1$ is adjacent to the lower side of the component area CA in the −y direction. A 2-$1^{st}$ sub-pixel $Sub_{2-1}$ is located in a second row $R_2$ located in the component area CA (e.g., below a center portion of the component area CA in the −y direction) and is spaced apart from the first row $R_1$ in the +y direction. The 3-$1^{st}$ sub-pixel $Sub_{3-1}$ and a 3-$2^{nd}$ sub-pixel $Sub_{3-2}$ are located in a third row $R_3$ that is positioned adjacent to an upper side (e.g., in the y direction) of the component area CA. The third row $R_3$ is adjacent to the upper side of the component area CA in the +y direction and is spaced apart from the second row $R_2$ in the +y direction.

In the exemplary embodiment of FIG. 10, each of the first row $R_1$, the second row $R_2$, and the third row $R_3$ is illustrated as including two rows extending in the x-axis direction and spaced apart in the y direction. For example, in the case of the third row R3, a red sub-pixel Pr shown in the upper left corner of the exemplary embodiment of FIG. 10, and a green sub-pixel Pg shown in the +x direction from the red sub-pixel Pr, a blue sub-pixel Pb shown in the −y direction from the red sub-pixel Pr, and a green sub-pixel Pg shown in the +x direction from the blue sub-pixel Pb may constitute one pixel. Therefore, in the exemplary embodiment of FIG. 10, the third row R3 is illustrated as including two rows extending in the x-axis direction. This also applies to the first row R1 or the second row R2. However, exemplary embodiments of the present inventive concepts are not limited thereto. For example, in another exemplary embodiment, each of the first row R1, the second row R2, and the third row R3 may include one row extending in the x-axis direction, and a red sub-pixel Pr, a green sub-pixel Pg located in the +x direction from the red sub-pixel Pr, and a blue sub-pixel Pb located in the +x direction from the green sub-pixel Pg may be repeatedly arranged in the one row. In this exemplary embodiment, the red sub-pixel Pr, the green sub-pixel Pg located in the +x direction from the red sub-pixel Pr, and the blue sub-pixel Pb located in the +x direction from the green sub-pixel Pg may constitute one pixel. In other exemplary embodiments, the arrangement of sub-pixels forming a pixel may vary. Hereinafter, a case where sub-pixels are arranged as shown in FIG. 10 will be described for convenience of explanation.

The 1-$1^{st}$ sub-pixel $Sub_{1-1}$, the 1-$2^{nd}$ sub-pixel $Sub_{1-2}$, the 3-$1^{st}$ sub-pixel $Sub_{3-1}$, and the 3-$2^{nd}$ sub-pixel $Sub_{3-2}$ may be located in the main display area MDA, and the 2-$1^{st}$ sub-pixel $Sub_{2-1}$ may be located in the component area CA. In this exemplary embodiment, with the component area CA at the center, the 1-$1^{st}$ sub-pixel $Sub_{1-1}$ and the 1-$2^{nd}$ sub-pixel $Sub_{1-2}$ are located in the first row $R_1$ which is adjacent the lower side of the component area CA (e.g., adjacent in the −y direction). The 3-$1^{st}$ sub-pixel $Sub_{3-1}$ and the 3-$2^{nd}$ sub-pixel $Sub_{3-2}$ are located in the third row $R_3$ which is adjacent to the upper side of the component area CA (e.g., adjacent in the +y direction). Accordingly, the component area CA has transmission areas TA between the first row $R_1$ and the second row $R_2$ and between the second row $R_2$ and the third row $R_3$. Accordingly, the component area CA has a transmission area TA arranged outside the 2-$1^{st}$ sub-pixel $Sub_{2-1}$ (e.g., outside in the −y and +y directions and in the −x and +x directions).

The first data line $D_1$ extends substantially in the +y direction across the component area CA from the first row $R_1$ to the third row $R_3$ and electrically connects a pixel circuit of the 1-$1^{st}$ sub-pixel $Sub_{1-1}$ in the main display area MDA, a pixel circuit of the 2-$1^{st}$ sub-pixel $Sub_{2-1}$ in the component area CA, and a pixel circuit of the 3-$1^{st}$ sub-pixel $Sub_{3-1}$ in the main display area MDA.

The 2-$1^{st}$ data line $D_{2-1}$ also extends in the +y direction and is electrically connected to a pixel circuit of the 1-$2^{nd}$ sub-pixel $Sub_{1-2}$ located in the main display area MDA. However, the 2-$1^{st}$ data line $D_{2-1}$ is not connected to auxiliary sub-pixels Pa located in the component area CA. For example, the 2-$1^{st}$ data line $D_{2-1}$ may terminate in a portion of the main display area MDA which is adjacent to the lower side of the component area CA (e.g., adjacent in the −y direction), or is located in the component area CA. The 2-$1^{st}$ data line $D_{2-1}$ may not extend to the second row $R_2$ or the third row $R_3$.

The 2-$2^{nd}$ data line $D_{2-2}$ extends in the −y direction and is electrically connected to a pixel circuit of the 3-$2^{nd}$ sub-pixel $Sub_{3-2}$ located in the main display area MDA. The 2-$2^{nd}$ data line $D_{2-2}$ is not connected to auxiliary sub-pixels Pa located in the component area CA. For example, the 2-$2^{nd}$ data line $D_{2-2}$ may terminate in a portion of the main display area MDA which is adjacent to an upper side of the component area CA (e.g., adjacent in the +y direction), or is located in the component area CA. The 2-$2^{nd}$ data line $D_{2-2}$ may not extend to the first row $R_1$ or the second row $R_2$.

As described above with reference to the exemplary embodiment of FIG. 3, data lines DL transfer a data signal Dm from a data driving circuit 150, which is located outside the main display area MDA (e.g., in the −y direction) to the main sub-pixel Pm and the auxiliary sub-pixel Pa.

The 1-$1^{st}$ sub-pixel $Sub_{1-1}$ in the main display area MDA, the 2-$1^{st}$ sub-pixel $Sub_{2-1}$ in the component area CA, and the 3-$1^{st}$ sub-pixel $Sub_{3-1}$ in the main display area MDA are electrically connected to the first data line $D_1$ extending in the +y direction across the component area CA, and thus may receive the data signal Dm from the data driving circuit 150. The 1-$2^{nd}$ sub-pixel $Sub_{1-2}$, which is located in a portion of the main display area MDA adjacent to the lower side of the component area CA (e.g., adjacent in the −y direction), is electrically connected to the 2-$1^{st}$ data line $D_{2-1}$, and thus may receive the data signal Dm from the data driving circuit 150. However, the 3-$2^{nd}$ sub-pixel $Sub_{3-2}$, that is located in a portion of the main display area MDA adjacent to the upper side of the component area CA (e.g., adjacent in the +y direction), is electrically connected to the 2-$2^{nd}$ data line $D_{2-2}$. However, the 2-$2^{nd}$ data line $D_{2-2}$ extends in the −y direction toward the component area CA but does not extend across the component area CA to the main display area MDA located adjacent to the lower side of the component area CA (e.g., adjacent in the −y direction). Therefore, in this configuration, the data signal Dm is not applied to the 3-$2^{nd}$ sub-pixel $Sub_{3-2}$ located in the portion of the main display area MDA adjacent to the upper side of the component area CA (e.g., adjacent in the +y direction) by a data line.

However, since the display apparatus 1 according to the present inventive concepts includes a first bridge line $B_1$ as shown in the exemplary embodiment of FIG. 11, the data signal Dm may also be applied to the 3-$2^{nd}$ sub-pixel $Sub_{3-2}$ located in the portion of the main display area MDA adjacent to the upper side of the component area CA (e.g., adjacent in the +y direction). For example, a first side of the first bridge line $B_1$ contacts the 2-$1^{st}$ data line $D_{2-1}$ located in the first row $R_1$ that is adjacent to the lower side of the component area CA (e.g., adjacent in the −y direction), and a second side of the first bridge line $B_1$ contacts the 2-$2^{nd}$ data line $D_{2-2}$ located in third row $R_3$ that is adjacent to the upper side of the component area CA (e.g., adjacent in the +y direction). Therefore, the 2-$2^{nd}$ data line $D_{2-2}$ is electrically connected to the 2-$1^{st}$ data line $D_{2-1}$. Accordingly, the data signal Dm may be applied to the 3-$2^{nd}$ sub-pixel $Sub_{3-2}$ through the 2-$2^{nd}$ data line $D_{2-2}$.

The first bridge line $B_1$ is located on a different layer than the first data line $D_1$, the 2-$1^{st}$ data line $D_{2-1}$, and the 2-$2^{nd}$ data line $D_{2-2}$. For example, in an exemplary embodiment, the first data line $D_1$, the 2-$1^{st}$ data line $D_{2-1}$, and the 2-$2^{nd}$ data line $D_{2-2}$ may be disposed on the interlayer insulating layer 115 as shown in the exemplary embodiment of FIG. 9, and the first bridge line $B_1$ may be disposed on the first planarization layer 117 (see FIG. 9) covering the first data line $D_1$, the 2-$1^{st}$ data line $D_{2-1}$, and the 2-$2^{nd}$ data line $D_{2-2}$. In this exemplary embodiment, the first data line $D_1$, the 2-$1^{st}$ data line $D_{2-1}$, and the 2-$2^{nd}$ data line $D_{2-2}$ may be formed of the same material as and simultaneously with the first source electrode S1, the first drain electrode D1, the second source electrode S2, and the second drain electrode D2, and the first bridge line $B_1$ may be formed of the same material as and simultaneously with the contact metal layers CM and CM'. The first bridge line $B_1$ may be electrically connected to each of the 2-$1^{st}$ data lines $D_{2-1}$ and the 2-$2^{nd}$ data line $D_{2-2}$ located under the first planarization layer 117 through contact holes formed in the first planarization layer 117.

The display apparatus 1 according to the present exemplary embodiment may display a high-resolution image in a portion of the main display area MDA located adjacent to a lower side of the component area CA (e.g., adjacent in the −y direction), and may also display a high-resolution image in a portion of the main display area MDA adjacent to an upper side of the component area CA (e.g., adjacent in the +y direction).

The first bridge line $B_1$ may have a portion (e.g., an overlapping portion) extending along at least a portion of the first data line $D_1$. Accordingly, the orthographic projection image of the portion of the first bridge line $B_1$, which extends along the at least a portion of the first data line $D_1$, in a direction perpendicular to the top surface of the substrate 100 (e.g., in a z direction) overlaps an orthographic projection image of the first data line $D_1$ in the direction (the z direction) perpendicular to the top surface of the substrate 100. This is possible because the first bridge line $B_1$ is located on a different layer than a layer on which the first data line $D_1$ is located. Referring to the exemplary embodiments of FIGS. 10 and 11, the first bridge line $B_1$ substantially overlaps the first data line $D_1$ (e.g., in the z direction) in all regions except a region adjacent to an edge of the upper side of the component area CA and a region adjacent to an edge of the lower side of the component area CA.

Through this configuration, the display apparatus 1 according to the present exemplary embodiment may display a high-resolution image even in a portion of the main display area MDA located adjacent to an upper side of the component area CA (e.g., adjacent in the +y direction). The light transmission area of the transmission area TA in the component area CA may have a large area (e.g., in a plane defined by the x and y directions) because the first bridge line $B_1$ does not cause a loss in the light transmission area of the transmission area TA.

As shown in the exemplary embodiments of FIGS. 10 and 11, a $1\text{-}3^{rd}$ sub-pixel $Sub_{1\text{-}3}$ and a $1\text{-}4^{th}$ sub-pixel $Sub_{1\text{-}4}$ may be located in the first row $R_1$, a $2\text{-}2^{nd}$ sub-pixel $Sub_{2\text{-}2}$ may be located in the second row $R_2$, and a $3\text{-}3^{rd}$ sub-pixel $Sub_{3\text{-}3}$ and a $3\text{-}4^{th}$ sub-pixel $Sub_{3\text{-}4}$ may be located in the third row $R_3$. The $1\text{-}3^{rd}$ sub-pixel $Sub_{1\text{-}3}$ is located adjacent to the $1\text{-}1^{st}$ sub-pixel $Sub_{1\text{-}1}$ in the −x direction which is an opposite direction to the direction (e.g., the +x direction) that the $1\text{-}2^{nd}$ sub-pixel $Sub_{1\text{-}2}$ is disposed with respect to the $1\text{-}1^{st}$ sub-pixel $Sub_{1\text{-}1}$. The $1\text{-}4^{th}$ sub-pixel $Sub_{1\text{-}4}$ is located between the $1\text{-}1^{st}$ sub-pixel $Sub_{1\text{-}1}$ and the $1\text{-}2^{nd}$ sub-pixel $Sub_{1\text{-}2}$. The $3\text{-}3^{rd}$ sub-pixel $Sub_{3\text{-}3}$ is located adjacent to the $3\text{-}1^{st}$ sub-pixel $Sub_{3\text{-}1}$ in the −x direction which is an opposite direction to the direction (e.g., the +x direction) that the $3\text{-}2^{nd}$ sub-pixel $Sub_{3\text{-}2}$ is disposed with respect to the $3\text{-}1^{st}$ sub-pixel $Sub_{3\text{-}1}$. The $3\text{-}4^{th}$ sub-pixel $Sub_{3\text{-}4}$ is located between the $3\text{-}1^{st}$ sub-pixel $Sub_{3\text{-}1}$ and the $3\text{-}2^{nd}$ sub-pixel $Sub_{3\text{-}2}$.

Accordingly, the $1\text{-}3^{rd}$ sub-pixel $Sub_{1\text{-}3}$, the $1\text{-}4^{th}$ sub-pixel $Sub_{1\text{-}4}$, the $3\text{-}3^{rd}$ sub-pixel $Sub_{3\text{-}3}$, and the $3\text{-}4^{th}$ sub-pixel $Sub_{3\text{-}4}$ may be located in the main display area MDA. The $2\text{-}2^{nd}$ sub-pixel $Sub_{2\text{-}2}$ may be located in the component area CA. In addition, with the component area CA at the center, the $1\text{-}3^{rd}$ sub-pixel $Sub_{1\text{-}3}$ and the $1\text{-}4^{th}$ sub-pixel $Sub_{1\text{-}4}$ are located adjacent a lower side of the component area CA (e.g., adjacent in the −y direction) and the $3\text{-}3^{rd}$ sub-pixel $Sub_{3\text{-}3}$ and the $3\text{-}4^{th}$ sub-pixel $Sub_{1\text{-}4}$ are located adjacent an upper side of the component area CA (e.g., adjacent in the +y direction). The component area CA has a transmission area TA arranged outside the $2\text{-}2^{nd}$ sub-pixel $Sub_{2\text{-}2}$.

The third data line $D_3$ extends substantially in the +y direction across the component area CA from the first row $R_1$ to the third row $R_3$ and electrically connects a pixel circuit of the $1\text{-}3^{rd}$ sub-pixel $Sub_{1\text{-}3}$ in the main display area MDA, a pixel circuit of the $2\text{-}2^{nd}$ sub-pixel $Sub_{2\text{-}2}$ in the component area CA, and a pixel circuit of the $3\text{-}3^{rd}$ sub-pixel $Sub_{3\text{-}3}$ in the main display area MDA.

The $4\text{-}1^{st}$ data line $D_{4\text{-}1}$ also extends in the +y direction and is electrically connected to a pixel circuit of the $1\text{-}4^{th}$ sub-pixel $Sub_{1\text{-}4}$ located in the main display area MDA. However, the $4\text{-}1^{st}$ data line $D_{4\text{-}1}$ is not connected to auxiliary sub-pixels Pa located in the component area CA. For example, the $4\text{-}1^{st}$ data line $D_{4\text{-}1}$ may terminate in a portion of the main display area MDA which is adjacent to the lower side of the component area CA (e.g., adjacent in the −y direction), or is located in the component area CA. The $4\text{-}1^{st}$ data line $D_{4\text{-}1}$ may not extend to the second row $R_2$ or the third row $R_3$.

The $4\text{-}2^{nd}$ data line $D_{4\text{-}2}$ extends in the −y direction and is electrically connected to a pixel circuit of the $3\text{-}4^{th}$ sub-pixel $Sub_{3\text{-}4}$ located in the main display area MDA. The $4\text{-}2^{nd}$ data line $D_{4\text{-}2}$ is not connected to auxiliary sub-pixels Pa located in the component area CA. For example, the $4\text{-}2^{nd}$ data line $D_{4\text{-}2}$ may terminate in a portion of the main display area MDA, which is adjacent to an upper side of the component area CA (e.g., adjacent in the +y direction), or is located in the component area CA. The $4\text{-}2^{nd}$ data line $D_{4\text{-}2}$ may not extend to the first row $R_1$ or the second row $R_2$.

The $1\text{-}3^{rd}$ sub-pixel $Sub_{1\text{-}3}$ in the main display area MDA, the $2\text{-}2^{nd}$ sub-pixel $Sub_{2\text{-}2}$ in the component area CA, and the $3\text{-}3^{rd}$ sub-pixel $Sub_{3\text{-}3}$ in the main display area MDA are electrically connected to the third data line $D_3$ extending in the +y direction, and thus may receive the data signal Dm from the data driving circuit 150. The $1\text{-}4^{th}$ sub-pixel $Sub_{1\text{-}4}$ located in a portion of the main display area MDA adjacent to the lower side of the component area CA (e.g., adjacent in the −y direction) is electrically connected to the $4\text{-}1^{st}$ data line $D_{4\text{-}1}$, and thus may receive the data signal Dm from the data driving circuit 150. However, the $3\text{-}4^{th}$ sub-pixel $Sub_{3\text{-}4}$ that is located in a portion of the main display area MDA adjacent to the upper side of the component area CA (e.g., adjacent in the +y direction) is electrically connected to the $4\text{-}2^{nd}$ data line $D_{4\text{-}2}$. However, the $4\text{-}2^{nd}$ data line $D_{4\text{-}2}$ extends in the −y direction toward the component area CA but does not extend across the component area CA to the main display area MDA adjacent to the lower side of the component area CA (e.g., adjacent in the −y direction). Therefore, in this configuration, the data signal Dm is not applied to the $3\text{-}4^{th}$ sub-pixel $Sub_{3\text{-}4}$ located in the portion of the main display area MDA adjacent to the upper side of the component area CA (e.g., adjacent in the +y direction) by a data line.

However, since the display apparatus 1 according to the present inventive concepts includes a second bridge line $B_2$ as shown in the exemplary embodiment of FIG. 11, the data signal Dm may also be applied to the $3\text{-}4^{th}$ sub-pixel $Sub_{3\text{-}4}$ located in the portion of the main display area MDA adjacent to the upper side of the component area CA (e.g., adjacent in the +y direction). For example, a first side of the second bridge line $B_2$ contacts the $4\text{-}1^{st}$ data line $D_{4\text{-}1}$ located in the first row $R_1$ that is adjacent to the lower side of the component area CA (e.g., adjacent in the −y direction), and a second side of the second bridge line $B_2$ contacts the $4\text{-}2^{nd}$ data line $D_{4\text{-}2}$ located in the third row $R_3$ that is adjacent to the upper side of the component area CA (e.g., adjacent in the +y direction). Therefore, the $4\text{-}2^{nd}$ data line $D_{4\text{-}2}$ is electrically connected to the $4\text{-}1^{st}$ data line $D_{4\text{-}1}$. Accordingly, the data signal Dm may be applied to the $3\text{-}4^{th}$ sub-pixel $Sub_{3\text{-}4}$ through the $4\text{-}2^{nd}$ data line $D_{4\text{-}2}$.

The second bridge line $B_2$ is located on a different layer than the third data line $D_3$, the $4\text{-}1^{st}$ data line $D_{4\text{-}1}$, and the $4\text{-}2^{nd}$ data line $D_{4\text{-}2}$. For example, in an exemplary embodiment, the third data line $D_3$, the $4\text{-}1^{st}$ data line $D_{4\text{-}1}$, and the $4\text{-}2^{nd}$ data line $D_{4\text{-}2}$ may be disposed on the interlayer insulating layer 115 as shown in the exemplary embodiment of FIG. 9, and the second bridge line $B_2$ may be disposed on the first planarization layer 117 as shown in the exemplary embodiment of FIG. 9. In this exemplary embodiment, the third data line $D_3$, the $4\text{-}1^{st}$ data line $D_{4\text{-}1}$, and the $4\text{-}2^{nd}$ data line $D_{4\text{-}2}$ may be formed of the same material as and simultaneously with the first source electrode S1, the first drain electrode D1, the second source electrode S2, and the second drain electrode D2, and the second bridge line $B_2$ may be formed of the same material as and simultaneously with the contact metal layers CM and CM'. The second bridge line $B_2$ may be electrically connected to each of the 4-$1^{st}$ data lines $D_{4-1}$ and the 4-$2^{nd}$ data line $D_{4-2}$ located under the first planarization layer 117 through contact holes formed in the first planarization layer 117.

The display apparatus 1 according to the present exemplary embodiment may display a high-resolution image in a portion of the main display area MDA located adjacent to a lower side of the component area CA (e.g., adjacent in the −y direction) and may also display a high-resolution image in a portion of the main display area MDA adjacent to an upper side of the component area CA (e.g., adjacent in the +y direction).

The second bridge line $B_2$ may have a portion (e.g., an overlapping portion) extending along at least a portion of the third data line $D_3$. Accordingly, the orthographic projection image of the portion of the second bridge line $B_2$, which extends along the at least a portion of the third data line $D_3$, in a direction (the z direction) perpendicular to the top surface of the substrate 100 overlaps an orthographic projection image of the third data line $D_3$ in the direction (the z direction) perpendicular to the top surface of the substrate 100. This is possible because the second bridge line $B_2$ is disposed on a different layer than a layer on which the third data line $D_3$ is disposed thereon. Referring to the exemplary embodiments of FIGS. 10 and 11, the second bridge line $B_2$ substantially overlaps (e.g., in the z direction) the third data line $D_3$ in all regions except a region adjacent to an edge of the upper side of the component area CA and a region adjacent to an edge of the lower side of the component area CA.

Through this configuration, the display apparatus 1 according to the present exemplary embodiment may display a high-resolution image even in a portion of the main display area MDA located adjacent to an upper side of the component area CA (e.g., adjacent in the +y direction). The light transmission area of the transmission area TA in the component area CA may have a large area because the second bridge line $B_2$ does not cause a loss in the light transmission area of the transmission area TA.

Figure 12:
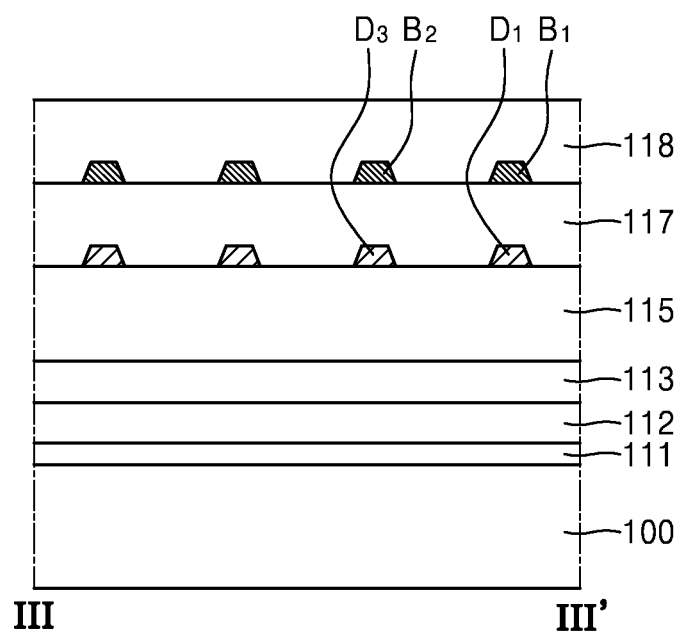
FIG. 12 is a cross-sectional view of an arrangement of sub-pixels and wiring lines taken along line III-III' of FIGS. 10 and 11 according to an exemplary embodiment of the present inventive concepts.

FIG. 12 is a schematic cross-sectional view of an arrangement of sub-pixels and wiring lines taken along line III-III' of FIGS. 10 and 11 according to an exemplary embodiment of the present inventive concepts. As shown in the exemplary embodiment of FIG. 12, the third data line $D_3$ is disposed on the same layer as the first data line $D_1$ (e.g., disposed on the interlayer insulating layer 115), and the second bridge line $B_2$ is disposed on the same layer as the first bridge line $B_1$ (e.g., disposed on the first planarization layer 117). The first data line $D_1$ and the third data line $D_3$ may also be located on the same layer as the 2-$1^{st}$ data line $D_{2-1}$, the 2-$2^{nd}$ data line $D_{2-2}$, the 4-$1^{st}$ data line $D_{4-1}$, and the 4-$2^{nd}$ data line $D_{4-2}$. As shown in the exemplary embodiment of FIG. 12, the first bridge line $B_1$ and the second bridge line $B_2$ may have portions overlapping the first data line $D_1$ and the third data line $D_3$ (e.g., in the z direction), respectively, thereby reducing area loss of the transmission area TA.

The display panel 10 may include an additional data line Da electrically connected to a pixel circuit of a sub-pixel located in the first row $R_1$ adjacent to the 1-$3^{rd}$ sub-pixel $Sub_{1-3}$ in the −x direction. The additional data line Da may extend substantially in the +y direction and may extend into the component area CA. The additional data line Da may have a shape substantially parallel to the first data line $D_1$. In this exemplary embodiment, the additional data line Da is electrically connected to a pixel circuit of one sub-pixel in the component area CA, and then may extend substantially in the +y direction along the edge of the transmission area TA outside of the 2-$1^{st}$ sub-pixel $Sub_{2-1}$ in the −x direction. The additional data line Da may be electrically connected to a pixel circuit of a main sub-pixel Pm located in the third row $R_3$ in a portion of the main display area MDA that is adjacent to an upper side of the component area CA (e.g., adjacent in the +y direction). For example, as shown in the exemplary embodiment of FIG. 10, the additional data line Da may be electrically connected to a sub-pixel located in the third row $R_3$ adjacent to the 3-$3^{rd}$ sub-pixel $Sub_{3-3}$ in the −x direction.

Figure 13:
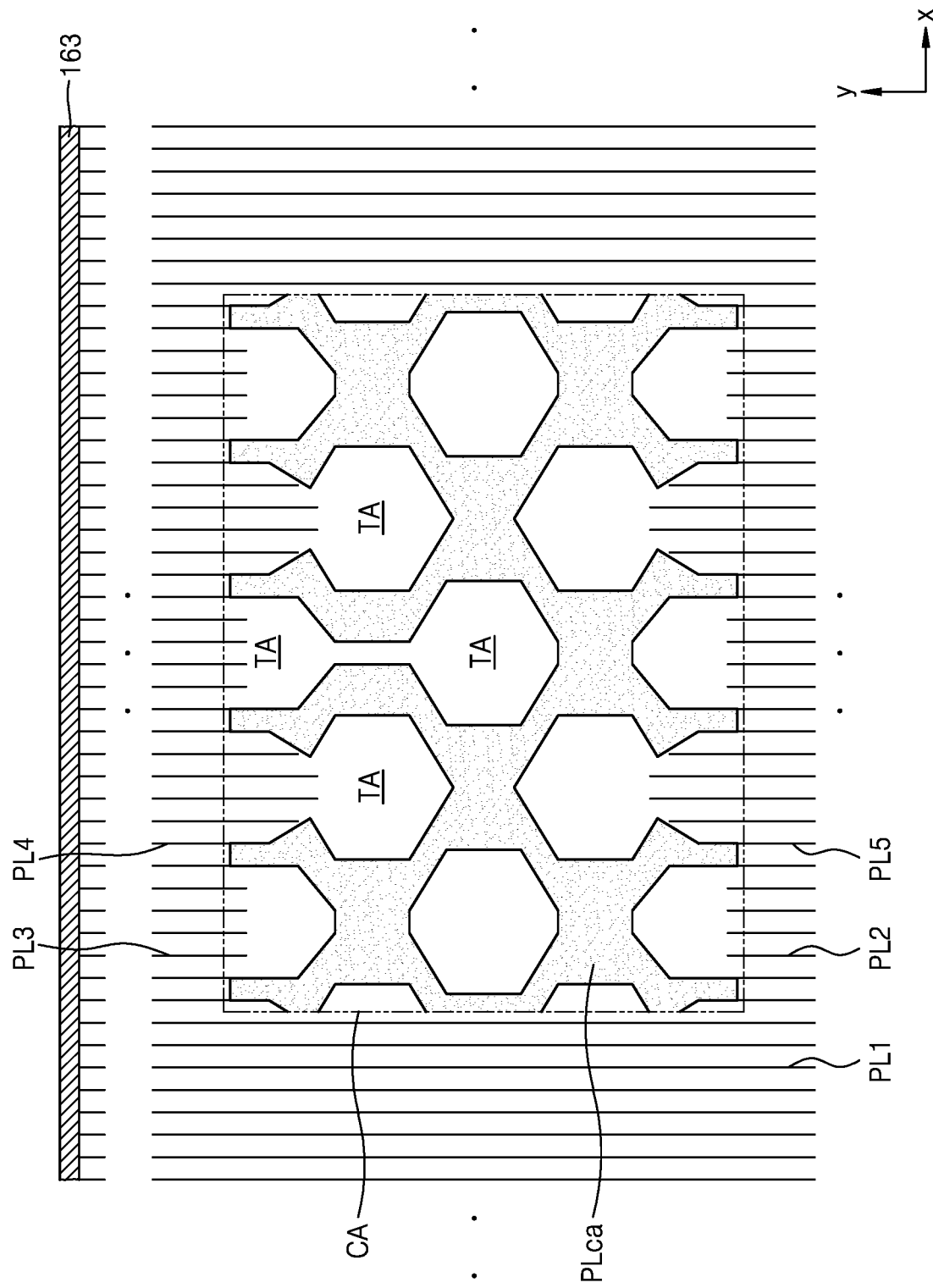
FIG. 13 is a plan view illustrating an arrangement of driving voltage lines and an auxiliary driving voltage line of the display panel of FIG. 3 according to an exemplary embodiment of the present inventive concepts.

As described above, a driving voltage ELVDD is applied to a pixel circuit of each sub-pixel. FIG. 13 is a schematic plan view illustrating an arrangement of driving voltage lines PL1, PL2, PL3, PL4, and PL5 and an auxiliary driving voltage line PLca of the display panel 10 of FIG. 3 according to an exemplary embodiment of the present inventive concepts.

Driving voltages from the driving voltage lines PL2 and PL5 electrically connected to the first sub-line 162 (see FIG. 3) are applied to main sub-pixels Pm in a portion of the main display area MDA adjacent to a lower side of the component area CA (e.g., adjacent in the −y direction). Driving voltages from the driving voltage lines PL3 and PL4 electrically connected to the second sub-line 163 (see FIG. 3) are applied to main sub-pixels Pm in a portion of the main display area MDA adjacent to an upper side of the component area CA (e.g., adjacent in the +y direction). A driving voltage from the driving voltage line PL1 electrically connected to the first sub-line 162 and/or the second sub-line 163 is applied to main sub-pixels Pm in the remaining portion of the main display area MDA.

In an exemplary embodiment, driving voltages from the driving voltage lines PL4 and PL5 electrically connected to the first sub-line 162 and/or the second sub-line 163 may also be applied to the auxiliary sub-pixels Pa in the component area CA. However, in another exemplary embodiment as shown in FIG. 13, a driving voltage may be applied to the auxiliary sub-pixels Pa in the component area CA through an auxiliary driving voltage line PLca located in the component area CA.

The auxiliary driving voltage line PLca is disposed on a different layer than the first data line $D_1$ and the first bridge line $B_1$. For example, in an exemplary embodiment, the auxiliary driving voltage line PLca may be disposed on the same layer as and formed of the same material as the first metal layer BSM1 and the second metal layer BSM2 as shown in the exemplary embodiment of FIG. 9. For example, the auxiliary driving voltage line PLca may be disposed directly on the second inorganic layer 104 (FIG. 9). In this exemplary embodiment, the auxiliary driving voltage line PLca is located under the first data line $D_1$ and the first bridge line $B_1$. The driving voltage lines PL1, PL2, PL3, PL4, and PL5 may be located on the same layer as the first data line $D_1$ and the third data line $D_3$.

Furthermore, the auxiliary driving voltage line PLca may overlap (e.g., in the z direction) the first data line $D_1$, the third data line $D_3$, the first bridge line $B_1$, and the second bridge line $B_2$, and may be electrically connected to the pixel circuit of the 2-$1^{st}$ sub-pixel $Sub_{2-1}$, which is an auxiliary sub-pixel Pa located in the component area CA, to apply a driving voltage to the pixel circuit. A contact hole may be formed in the buffer layer 111 or the like so that the pixel circuit of the 2-$1^{st}$ sub-pixel $Sub_{2-1}$ is electrically connected to the auxiliary driving voltage line PLca. Furthermore, the auxiliary driving voltage line PLca may be electrically connected to the driving voltage lines PL4 and PL5 located on a different layer than the auxiliary driving voltage line PLca, through contact holes at the edge of the component area CA.

The auxiliary driving voltage line PLca may protect pixel circuits PC in the component area CA from light from the outside or light from the component 20 (see FIG. 2). In addition, since the auxiliary driving voltage line PLca overlaps the first data line $D_1$, the third data line $D_3$, the first bridge line $B_1$, and the second bridge line $B_2$, the auxiliary driving voltage line PLca may prevent or reduce diffraction of light occurring due to small gaps between various wiring lines such as the first data line $D_1$, the third data line $D_3$, the first bridge line $B_1$, and the second bridge line $B_2$ which may cause noise in data collected by a component 20 such as an imaging device. As shown in the exemplary embodiment of FIG. 13, the width (e.g., length in the x direction) of the auxiliary driving voltage line PLca may be greater than the width of each of the driving voltage lines PL1, PL2, PL3, PL4, and PL5.

In the exemplary embodiments of FIGS. 10 and 11, auxiliary sub-pixels Pa in the component area CA are illustrated as being arranged in a zigzag manner along the y-axis direction. However, exemplary embodiments of the present inventive concepts are not limited thereto. For example, as shown in the exemplary embodiments of FIGS. 14 and 15, which are schematic plan views illustrating an arrangement of sub-pixels and wiring lines of a display panel according to another exemplary embodiment, auxiliary sub-pixels Pa in a component area CA may be arranged in a matrix shape. As shown in the exemplary embodiments of FIGS. 14-15, unlike the exemplary embodiments of FIGS. 10-11, the auxiliary sub-pixels Pa are arranged in the component area CA in a plurality of aligned rows and columns. Therefore, portions of the transmission area TA disposed between adjacent columns of auxiliary sub-pixels Pa may extend from an upper edge of the component area CA to a lower edge of the component area CA. The portions of the transmission area TA disposed between adjacent rows may extend from an edge of the component area CA in the +x direction to an edge of the component area CA in the −x direction.

Figure 14:
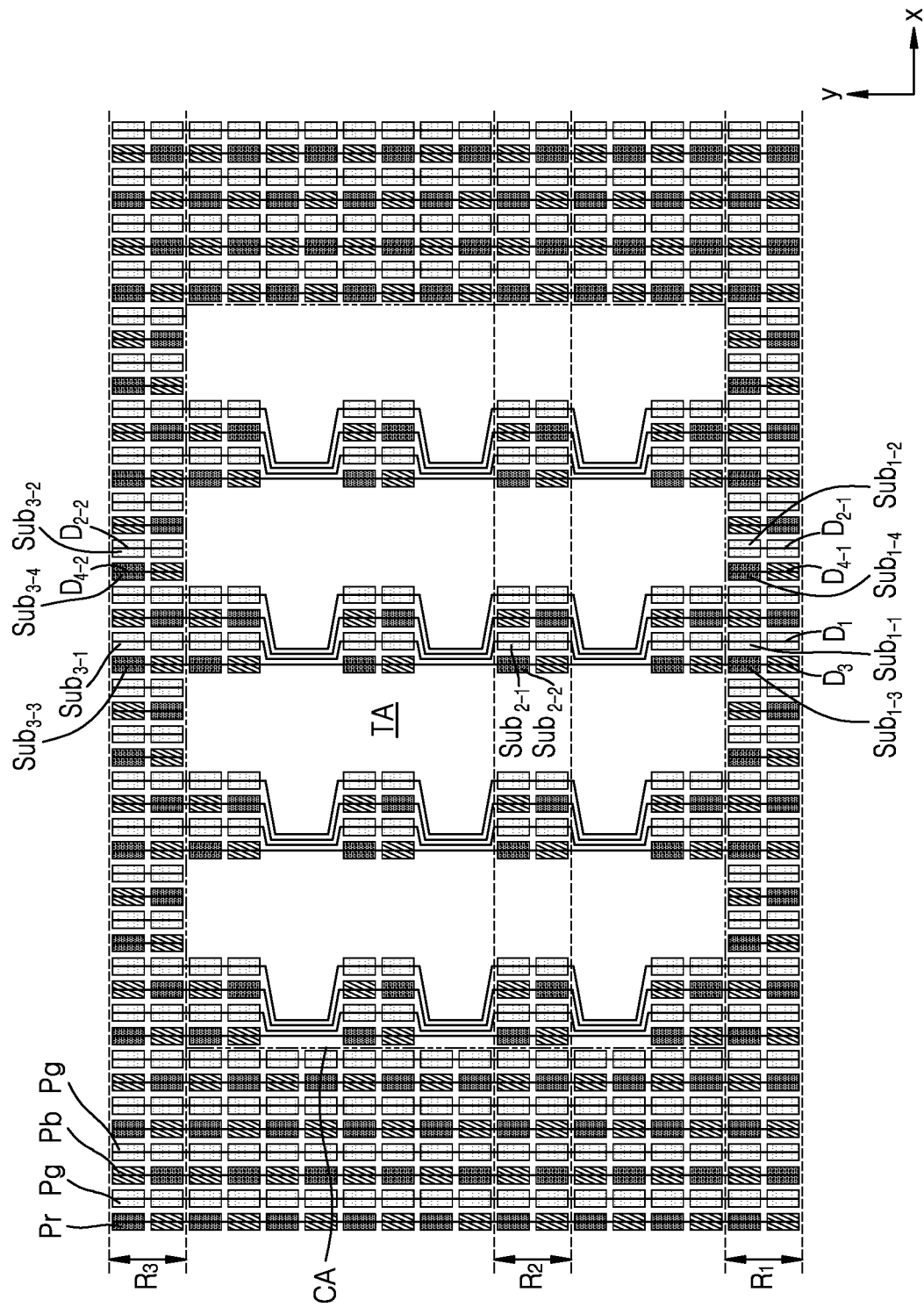
FIGS. 14 and 15 are plan views illustrating an arrangement of sub-pixels and wiring lines of a display panel according to exemplary embodiments of the present inventive concepts.
Figure 15:
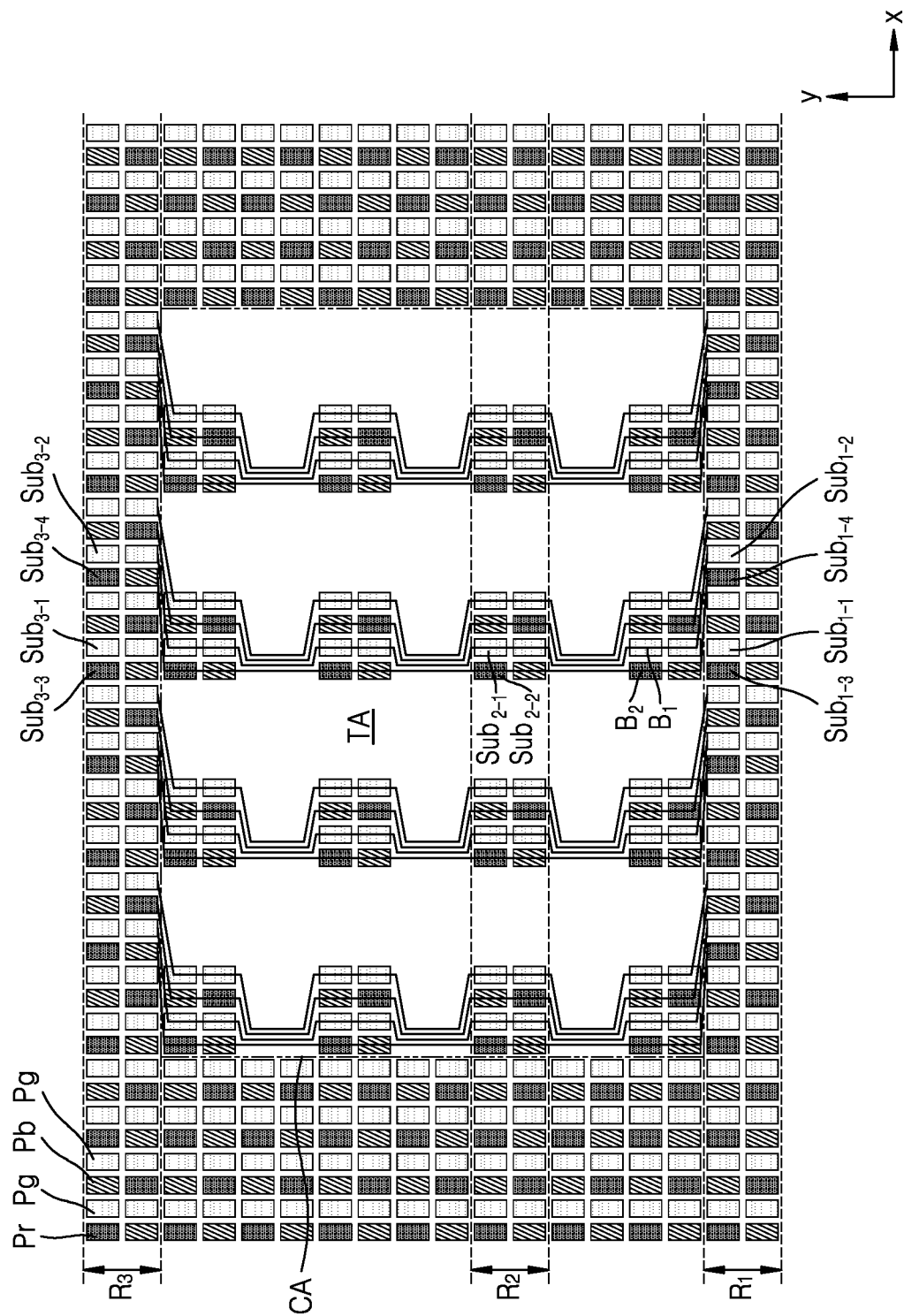

Since the exemplary embodiments of FIGS. 14 and 15 show only a portion of the display panel, more sub-pixels are omitted. Also, since the plan views show only wiring lines necessary for description, more wiring lines are omitted. The plan views show portions of the component area CA and a main display area MDA outside the component area CA. FIG. 14 illustrates a first data line $D_1$, a 2-$1^{st}$ data line $D_{2\text{-}1}$, a 2-$2^{nd}$ data line $D_{2\text{-}2}$, a third data line $D_3$, a 4-$1^{st}$ data line $D_{4\text{-}1}$, and a 4-$2^{nd}$ data line $D_{4\text{-}2}$ among wiring lines, and FIG. 15 illustrates a first bridge line $B_1$ and a second bridge line $B_2$ among the wiring lines. In the exemplary embodiments of FIGS. 14 and 15, the first data line $D_1$, the 2-$1^{st}$ data line $D_{2\text{-}1}$, the 2-$2^{nd}$ data line $D_{2\text{-}2}$, the third data line $D_3$, the 4-$1^{st}$ data line $D_{4\text{-}1}$, the 4-$2^{nd}$ data line $D_{4\text{-}2}$, the first bridge line $B_1$, and the second bridge line $B_2$ are illustrated as passing through the centers of sub-pixels solely for convenience of illustration. However, exemplary embodiments of the present inventive concepts are not limited thereto and the wires may pass through any portion of the respective sub-pixels. For example, the wiring lines may be modified in various ways, such as passing through the edges of sub-pixels, etc. This also applies to wiring lines shown in the drawings in connection with embodiments and modifications thereof described below.

Descriptions of the display apparatus 1 according to the exemplary embodiments described above with reference to FIGS. 10 to 13 may be applied to the display apparatus according to the exemplary embodiments of FIGS. 14-15.

For example, as shown in the exemplary embodiment of FIG. 14, the first data line $D_1$ extends substantially in the +y direction across the component area CA and electrically connects a pixel circuit of a 1-$1^{st}$ sub-pixel $Sub_{1\text{-}1}$ in the first row $R_1$ of the main display area MDA, a pixel circuit of a 2-$1^{st}$ sub-pixel $Sub_{2\text{-}1}$ in the second row $R_2$ in the component area CA, and a pixel circuit of a 3-$1^{st}$ sub-pixel $Sub_{3\text{-}1}$ in the third row $R_3$ in the main display area MDA.

The 2-$1^{st}$ data line $D_{2\text{-}1}$ also extends in the +y direction and is electrically connected to a pixel circuit of a 1-$2^{nd}$ sub-pixel $Sub_{1\text{-}2}$ located in the first row $R_1$ in the main display area MDA. However, the 2-$1^{st}$ data line $D_{2\text{-}1}$ is not connected to auxiliary sub-pixels Pa located in the component area CA, and the 2-$1^{st}$ data line $D_{2\text{-}1}$ terminates in a portion of the main display area MDA adjacent to a lower side of the component area CA (e.g., adjacent in the −y direction), or is located in the component area CA.

The 2-$2^{nd}$ data line $D_{2\text{-}2}$ extends in the −y direction and is electrically connected to a pixel circuit of a 3-$2^{nd}$ sub-pixel $Sub_{3\text{-}2}$ located in the third row $R_3$ of the main display area MDA. However, the 2-$2^{nd}$ data line $D_{2\text{-}2}$ is not connected to auxiliary sub-pixels Pa located in the component area CA, and the 2-$2^{nd}$ data line $D_{2\text{-}2}$ terminates in a portion of the main display area MDA adjacent to an upper side of the component area CA (e.g., adjacent in the +y direction), or is located in the component area CA.

As shown in the exemplary embodiment of FIG. 15, a first side of the first bridge line $B_1$ contacts the 2-$1^{st}$ data line $D_{2\text{-}1}$ located adjacent to the lower side of the component area CA (e.g., adjacent in the −y direction with respect to the component area CA), and the second side of the first bridge line $B_1$ contacts the 2-$2^{nd}$ data line $D_{2\text{-}2}$ adjacent to the upper side of the component area CA (e.g., adjacent in the +y direction with respect to the component area CA), and thus, the 2-$2^{nd}$ data line $D_{2\text{-}2}$ is electrically connected to the 2-$1^{st}$ data line $D_{2\text{-}1}$. Accordingly, the data signal Dm may be applied to the 3-$2^{nd}$ sub-pixel $Sub_{3\text{-}2}$ through the 2-$2^{nd}$ data line $D_{2\text{-}2}$.

Descriptions given above with reference to the exemplary embodiments of FIGS. 10 to 13 may be applied to the third data line $D_3$, the 4-$1^{st}$ data line $D_{4\text{-}1}$, the 4-$2^{nd}$ data line $D_{4\text{-}2}$, and the second bridge line $B_2$ in the exemplary embodiments of FIGS. 14-15.

As the first data line $D_1$ extends substantially in the +y direction, the first data line $D_1$ passes through the vicinity of the transmission area TA. In this embodiment, it is necessary to increase the area of the transmission area TA. Therefore, as shown in the exemplary embodiment of FIG. 14, the first data line $D_1$ may be appropriately bent when passing between the auxiliary sub-pixels Pa in the component area CA, and thus may be located as close as possible to the third data line $D_3$ extending in the +y direction in a straight line shape. This structure may also be applied to the first and second bridge lines $B_1$ and $B_2$, as shown in the exemplary embodiment of FIG. 15. For example, the first bridge line $B_1$ may be appropriately bent when passing between the auxiliary sub-pixels Pa in the component area CA, and thus may be located as close as possible to the second bridge line $B_2$ extending in the +y direction in a straight line shape.

Up to this point, exemplary embodiments in which the pixel group PG (see FIGS. 5 and 6) constituted by the auxiliary sub-pixels Pa in the component area CA has the same configuration as the pixel group PG (see FIG. 4) constituted by the main sub-pixels Pm in the main display area MDA has been described. However, exemplary embodiments of the present inventive concepts are not limited thereto.

Figure 16:
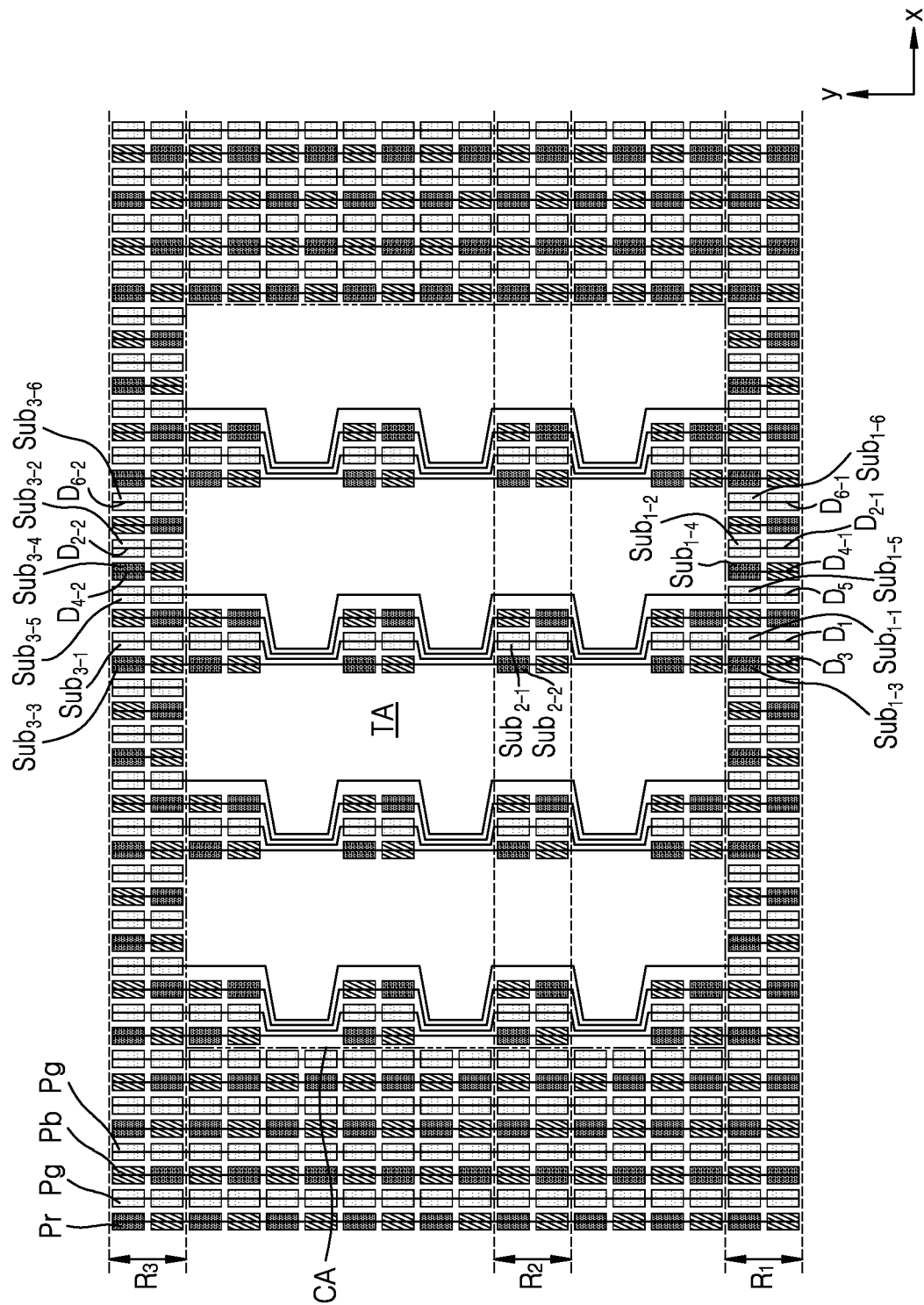
FIGS. 16 and 17 are plan views illustrating an arrangement of sub-pixels and wiring lines of a display panel according to exemplary embodiments of the present inventive concepts.
Figure 17:
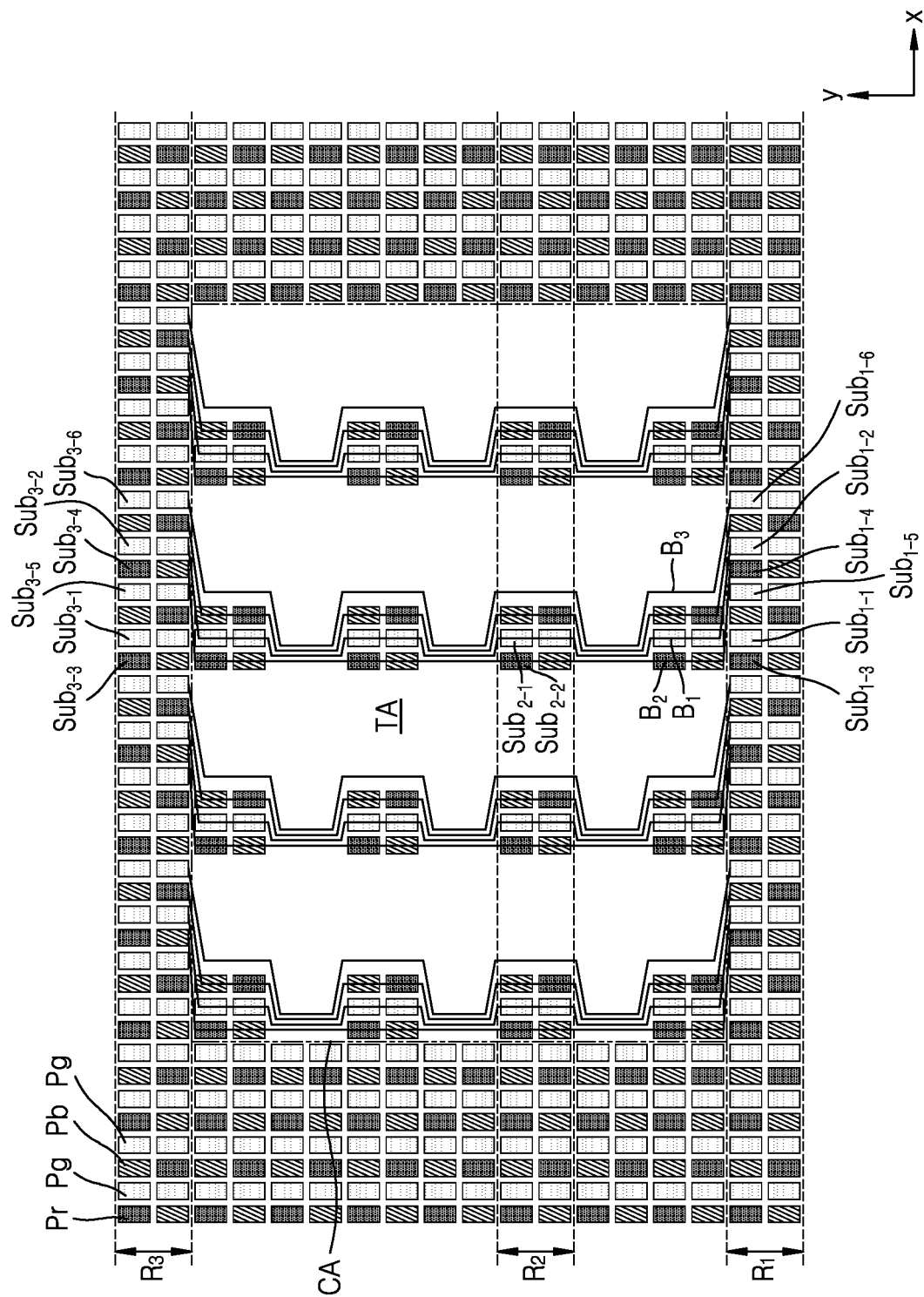

For example, as shown in the exemplary embodiments of FIGS. 16 and 17, which are schematic plan views illustrating an arrangement of sub-pixels and wiring lines of a display panel according to another exemplary embodiment, the pixel group PG in the main display area MDA may include a total of eight main sub-pixels Pm including a red sub-pixel Pr, a green sub-pixel Pg, a blue sub-pixel Pb, and a green sub-pixel Pg, which are arranged sequentially in the +x direction in a row, and a blue sub-pixel Pb, a green sub-pixel Pg, a red sub-pixel Pr, and a green sub-pixel Pg, which are arranged sequentially in a +x direction in a row therebelow. In contrast, the pixel group PG in the component area CA may include a total of six auxiliary sub-pixels Pa including a red sub-pixel Pr, a green sub-pixel Pg, and a blue sub-pixel Pb, which are arranged sequentially in a +x direction in a row, and a blue sub-pixel Pb, a green sub-pixel Pg, and a red sub-pixel Pr, which are arranged in a +x direction in a row therebelow. Through this configuration, a transmission area TA having a larger area may be secured in the component area CA.

In this embodiment, a pixel circuit of a 1-$5^{th}$ sub-pixel $Sub_{1-5}$, which is a main sub-pixel Pm in a first row $R_1$ adjacent to a lower side of the component area CA (e.g., adjacent in the −y direction), and a pixel circuit of a 3-$5^{th}$ sub-pixel $Sub_{3-5}$, which is a main sub-pixel Pm in a third row $R_3$ adjacent to an upper side of the component area CA (e.g., adjacent in the +y direction), are electrically connected to each other by a fifth data line $D_5$. The fifth data line $D_5$ crosses the component area CA, but is not connected to pixel circuits of the auxiliary sub-pixels Pa located in the component area CA. The fifth data line $D_5$ is not connected to pixel circuits of the auxiliary sub-pixels Pa because the number of main sub-pixels Pm included in the pixel group PG in the main display area MDA is greater than the number of auxiliary sub-pixels Pa included in the pixel group PG in the component area CA.

A 6-$1^{st}$ data line $D_{6-1}$ is electrically connected to a 1-$6^{th}$ sub-pixel $Sub_{1-6}$ located in the first row $R_1$. However, the 6-$1^{st}$ data line $D_{6-1}$ extends in the +y direction in the main display area MDA but does not extend across the component area CA. For example, the 6-$1^{st}$ data line $D_{6-1}$, may terminate in a portion of the main display area MDA which is adjacent to a lower side of the component area CA (e.g., adjacent in the −y direction), or is located in the component area CA. A 6-$2^{nd}$ data line $D_{6-2}$ is electrically connected to a 3-$6^{th}$ sub-pixel $Sub_{3-6}$ located in the third row $R_3$. However, the 6-$2^{nd}$ data line $D_{6-2}$ extends in the −y direction in the main display area MDA, but does not extend across the component area CA. For example, the 6-$2^{nd}$ data line $D_{6-2}$ may terminate in a portion of the main display area MDA which is adjacent to an upper side of the component area CA (e.g., adjacent in the +y direction), or is located in the component area CA.

As shown in the exemplary embodiment of FIG. 17, the 6-$1^{st}$ data line $D_{6-1}$ and the 6-$2^{nd}$ data line $D_{6-2}$ are electrically connected to each other by a third bridge line $B_3$ located on a different layer from that of the 6-$1^{st}$ data line $D_{6-1}$ and the 6-$2^{nd}$ data line $D_{6-2}$ and having one side contacting the 6-$1^{st}$ data line $D_{6-1}$ and the other side contacting the 6-$2^{nd}$ data line $D_{6-2}$. In addition, the third bridge line $B_3$ has a portion extending along at least a portion of the fifth data line $D_1$, and thus, the area of the transmission area TA may be large. The third bridge line $B_3$ does not pass through a portion occupied by an auxiliary sub-pixel Pa in the component area CA and extends substantially in the +y direction along the outside (e.g., in the +x direction) of the auxiliary sub-pixel Pa.

Descriptions of the 4-$1^{st}$ data line $D_{4-1}$, the 4-$2^{nd}$ data line $D_{4-2}$, and the second bridge line $B_2$ given above with reference to the exemplary embodiments of FIGS. 10 and 11 may be applied to the 6-$1^{st}$ data line $D_{6-1}$, the 6-$2^{nd}$ data line $D_{6-2}$, and the third bridge line $B_3$. For example, the 6-$1^{st}$ data line $D_{6-1}$ and the 6-$2^{nd}$ data line $D_{6-2}$ may be located on the same layer as the first data line $D_1$, the 2-$1^{st}$ data line $D_{2-1}$, and the 2-$2^{nd}$ data line $D_{2-2}$, and the third bridge line $B_3$ may be located on the same layer as the first bridge line $B_1$. The first bridge line $B_1$ and the third bridge line $B_3$ may be located on an insulating layer covering the first data line $D_1$, the 2-$1^{st}$ data line $D_{2-1}$, the 2-$2^{nd}$ data line $D_{2-2}$, the 6-$1^{st}$ data line $D_{6-1}$, and the 6-$2^{nd}$ data line $D_{6-2}$.

An embodiment in which the number of main sub-pixels Pm included in the pixel group PG in the main display area MDA is greater than the number of auxiliary sub-pixels Pa included in the pixel group PG in the component area CA has been described with reference to the exemplary embodiments of FIGS. 16 and 17. However, descriptions given with reference to the exemplary embodiments of FIGS. 16 and 17 may be applied to an exemplary embodiment in which the number of main sub-pixels Pm included in the pixel group PG in the main display area MDA is equal to the number of auxiliary sub-pixels Pa included in the pixel group PG in the component area CA. For example, the resolution in the component area CA is lower than about ½ of the resolution in the main display area MDA.

Exemplary embodiments of the present inventive concepts are not limited to the numbers of the wiring lines or sub-pixels shown in the exemplary embodiments of FIGS. 10-17. For example, in an exemplary embodiment, the display panel may include at least one first data line that extends across the component area CA from a lower row adjacent to a lower side of the component area CA (e.g., adjacent in the −y direction), such as the first row $R_1$, to an upper row adjacent to an upper side of the component area CA (e.g., adjacent in the +y direction), such as the third row $R_3$. The at least one first data line electrically connects main sub-pixels Pm in the lower row and the upper row and auxiliary sub-pixels Pa in the component area CA. At least one lower second data line is electrically connected to a main sub-pixel Pm in the lower row and does not extend across the component area CA. At least one upper second data line is electrically connected to a main sub-pixel Pm in the upper row and does not extend across the component area CA. The display panel includes at least one bridge line having a first end connected to one lower second data line and a second end connected to one upper second data line. The at least one bridge line is disposed on a different layer than the at least one first data line and each of the at least one bridge line has an overlapping portion that extends along at least a portion of one first data line as previously described.

A data line electrically connected to a pixel circuit of a main sub-pixel Pm located in a portion of the main display area MDA adjacent to a lower side of the component area CA (e.g., adjacent in a −y direction) may be electrically connected, by a bridge line located on a different layer than the data lines, to a data line electrically connected to a pixel circuit of a main sub-pixel Pm located in a portion of the main display area MDA adjacent to an upper side of the component area CA (e.g., adjacent in the +y direction). The bridge line has a portion extending along at least a portion of a data line crossing the component area CA, and thus, the area of the transmission area TA may be large. In addition, since the resolution in the component area CA is lower than about ½ of the resolution in the main display area MDA, a bridge line does not pass through a portion occupied by an auxiliary sub-pixel Pa in the component area CA and extends substantially in the +y direction along the outside of the auxiliary sub-pixel Pa.

Up to this point, a display apparatus having the display panel 10 and the component 20 that is an electronic element has been described. However, exemplary embodiments of the present inventive concepts are not limited thereto. For example, the display panel 10 itself as described above is also within the scope of the present inventive concepts.

According to one or more exemplary embodiments of the present inventive concepts, a display panel, which has an expanded display area to display an image even in an area where a component, which is an electronic element, is arranged, and a display apparatus including the display panel may be implemented. However, the scope of the present inventive concepts is not limited by these effects.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display panel comprising:
   a $1\text{-}1^{st}$ sub-pixel and a $1\text{-}2^{nd}$ sub-pixel disposed over a substrate to be in a main display area, the main display area outside a component area in a plan view;
   a $2\text{-}1^{st}$ sub-pixel and a $2\text{-}2^{nd}$ sub-pixel disposed over the substrate to be in the component area, the $2\text{-}1^{st}$ sub-pixel and the $2\text{-}2^{nd}$ sub-pixel including thin-film transistors, each of the thin-film transistors having a semiconductor layer; and
   a conductive layer disposed between the semiconductor layer and the substrate, the conductive layer including an opening having a polygonal shape in the component area in the plan view, at least one internal angle of the opening being an obtuse angle.

2. The display panel of claim 1, wherein the conductive layer overlaps the thin-film transistors of the $2\text{-}1^{st}$ sub-pixel and the $2\text{-}2^{nd}$ sub-pixel in the plan view.

3. The display panel of claim 1, wherein the conductive layer overlaps all thin-film transistors that the $2\text{-}1^{st}$ sub-pixel and the $2\text{-}2^{nd}$ sub-pixel include, in the plan view.

4. The display panel of claim 1, wherein the conductive layer overlaps pixel electrodes that the $2\text{-}1^{st}$ sub-pixel and the $2\text{-}2^{nd}$ sub-pixel include, in the plan view.

5. The display panel of claim 1, further comprising a metal layer disposed between the substrate and a thin-film transistor that the $1\text{-}1^{st}$ sub-pixel includes.

6. The display panel of claim 5, wherein the metal layer overlaps a part of a semiconductor layer of the thin-film transistor of the $1\text{-}1^{st}$ sub-pixel, the part of the semiconductor layer overlapping a gate electrode of the thin-film transistor of the $1\text{-}1^{st}$ sub-pixel.

7. The display panel of claim 5, wherein the conductive layer disposed on a same layer on which the metal layer is disposed.

8. The display panel of claim 1, wherein the opening of the conductive layer defines a transmission area in the component area.

9. The display panel of claim 8, a light-transmittance in the component area is different from a light-transmittance in the main display area.

10. The display panel of claim 8, further comprising an organic insulating layer disposed between the substrate and pixel electrodes that the $2\text{-}1^{st}$ sub-pixel and the $2\text{-}2^{nd}$ sub-pixel include, the organic insulating layer includes a hole corresponding to the opening of the conductive layer.

11. The display panel of claim 10, the hole of the organic insulating layer overlaps the opening of the conductive layer in the plan view.

12. The display panel of claim 1, wherein a group including the $1\text{-}1^{st}$ sub-pixel and the $1\text{-}2^{nd}$ sub-pixel repeatedly appears in the main display area and a group including the $2\text{-}1^{st}$ sub-pixel and the $2\text{-}2^{nd}$ sub-pixel repeatedly appears in the component area.

13. The display panel of claim 12, wherein the group including the $2\text{-}1^{st}$ sub-pixel and the $2\text{-}2^{nd}$ sub-pixel is disposed over the conductive layer.

14. The display panel of claim 12, wherein the group including the $2\text{-}1^{st}$ sub-pixel and the $2\text{-}2^{nd}$ sub-pixel overlaps the conductive layer in the plan view.

15. The display panel of claim 1, wherein the opening of the conductive layer has a shape of an octagon.

16. The display panel of claim 1, further comprising a bridge line transferring a signal to a sub-pixel in the main display area arranged next to the component area.

17. The display panel of claim 1, wherein the bridge line overlaps the conductive layer in the component area in the plan view.

18. The display panel of claim 1, further comprising a driving voltage line in the main display area, the driving voltage line being electrically connected to the $1\text{-}1^{st}$ sub-pixel to apply a driving voltage thereto, wherein the conductive layer is electrically connected to the driving voltage line.

19. The display panel of claim 18, wherein the driving voltage line is disposed on a layer which is different from a layer on which the conductive layer is disposed.

20. The display panel of claim 1, wherein the component area has a shape of a circle in the plan view.

21. A display panel comprising:
   a $1\text{-}1^{st}$ sub-pixel and a $1\text{-}2^{nd}$ sub-pixel disposed over a substrate to be in a main display area, the main display area outside a component area in a plan view;
   a $2\text{-}1^{st}$ sub-pixel and a $2\text{-}2^{nd}$ sub-pixel disposed over the substrate to be in the component area, the $2\text{-}1^{st}$ sub-pixel and the $2\text{-}2^{nd}$ sub-pixel including thin-film transistors, each of the thin-film transistors having a semiconductor layer; and
   a conductive layer disposed between the semiconductor layer and the substrate, the conductive layer including an opening having a polygonal shape in the component area in the plan view, the conductive layer overlapping the thin-film transistors of the $2\text{-}1^{st}$ sub-pixel and the $2\text{-}2^{nd}$ sub-pixel in the plan view.

* * * * *